US012670944B2

(12) United States Patent
Kim et al.

(10) Patent No.: US 12,670,944 B2
(45) Date of Patent: Jun. 30, 2026

(54) MEMORY DEVICE AND OPERATING METHOD THEREOF FOR APPLYING VOLTAGE TO TRANSISTOR BASED ON OUTPUT OF MEMORY CELL

(71) Applicant: Samsung Electronics Co., Ltd., Suwon-si (KR)

(72) Inventors: Dayoung Kim, Suwon-si (KR); Younghun Seo, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 202 days.

(21) Appl. No.: 18/461,763

(22) Filed: Sep. 6, 2023

(65) Prior Publication Data

US 2024/0290369 A1 Aug. 29, 2024

(30) Foreign Application Priority Data

Feb. 28, 2023 (KR) ........................ 10-2023-0026759

(51) Int. Cl.
G11C 29/04 (2006.01)
G11C 11/4074 (2006.01)
(Continued)

(52) U.S. Cl.
CPC ...... G11C 11/4074 (2013.01); G11C 11/4094 (2013.01); G11C 11/4099 (2013.01);
(Continued)

(58) Field of Classification Search
CPC ............ G11C 11/4074; G11C 11/4091; G11C 11/404; G11C 11/4099; G11C 11/4085;
(Continued)

(56) References Cited

U.S. PATENT DOCUMENTS 5,761,143 A * 6/1998 Fukuda ............... G11C 11/4074
365/210.1
6,269,039 B1 * 7/2001 Glossner, III ......... G11C 11/406
365/207
(Continued)

FOREIGN PATENT DOCUMENTS

KR 102046986 B1 11/2019
KR 102346409 B1 12/2021
KR 20220005200 A 1/2022

*Primary Examiner* — Mushfique Siddique
(74) *Attorney, Agent, or Firm* — Wolf, Greenfield & Sacks, P.C.

(57) ABSTRACT

A memory device including: a first cell including a first transistor and a capacitor connected to the first transistor and storing a voltage corresponding to data; a second cell including a second transistor; a voltage generation circuit for applying voltages to the source, gate, and drain of the second transistor and to the gate and back gate of the first transistor; a measuring circuit connected to the second cell, measuring at least one of a current and a voltage output from the second cell, and generating a leakage value based on at least one value of the measured current and voltage; and a monitoring circuit connected to the measuring circuit, calculating a threshold voltage of the second transistor based on the leakage value, and generating a control signal for controlling the voltage generation circuit based on the threshold voltage.

20 Claims, 12 Drawing Sheets

(51) Int. Cl.
| | |
|---|---|
| *G11C 11/4094* | (2006.01) |
| *G11C 11/4099* | (2006.01) |
| *G11C 29/02* | (2006.01) |
| *G11C 29/50* | (2006.01) |
| *G11C 11/4091* | (2006.01) |

(52) U.S. Cl.
CPC ............ *G11C 29/021* (2013.01); *G11C 29/04* (2013.01); *G11C 29/50* (2013.01); *G11C 11/4091* (2013.01)

(58) Field of Classification Search
CPC . G11C 11/4094; G11C 16/30; G11C 16/3404; G11C 29/021; G11C 29/04
See application file for complete search history.

(56) References Cited

U.S. PATENT DOCUMENTS

| | | | | |
|---|---|---|---|---|
| 6,344,877 | B1 * | 2/2002 | Gowda ................... | H04N 25/77 |
| | | | | 348/308 |
| 6,714,473 | B1 * | 3/2004 | Fiscus ................... | G11C 11/406 |
| | | | | 365/204 |
| 6,844,750 | B2 | 1/2005 | Hsu et al. | |
| 7,051,260 | B2 | 5/2006 | Ito et al. | |
| 7,417,469 | B2 | 8/2008 | Cheng et al. | |
| 7,474,125 | B2 * | 1/2009 | Kapoor .............. | H10D 30/0512 |
| | | | | 257/E21.446 |
| 7,883,962 | B2 | 2/2011 | Noble | |
| 9,318,477 | B2 | 4/2016 | Lee et al. | |
| 10,553,604 | B2 | 2/2020 | Lu et al. | |
| 10,910,397 | B2 | 2/2021 | Lu et al. | |
| 11,380,702 | B2 | 7/2022 | Kim et al. | |
| 11,545,505 | B2 | 1/2023 | Lu et al. | |
| 11,783,904 | B2 * | 10/2023 | Tran ................... | G11C 16/3459 |
| | | | | 365/185.22 |
| 2010/0039171 | A1 * | 2/2010 | Tsukada ................ | G11C 29/83 |
| | | | | 327/540 |
| 2015/0091188 | A1 | 4/2015 | Lee et al. | |
| 2019/0043879 | A1 | 2/2019 | Lu et al. | |
| 2020/0152653 | A1 | 5/2020 | Lu et al. | |
| 2020/0194433 | A1 * | 6/2020 | Bennett ................. | H10B 12/30 |
| 2021/0126005 | A1 | 4/2021 | Lu et al. | |
| 2022/0005820 | A1 | 1/2022 | Kim et al. | |
| 2022/0293619 | A1 | 9/2022 | Kim et al. | |
| 2023/0005950 | A1 | 1/2023 | Lu et al. | |

* cited by examiner

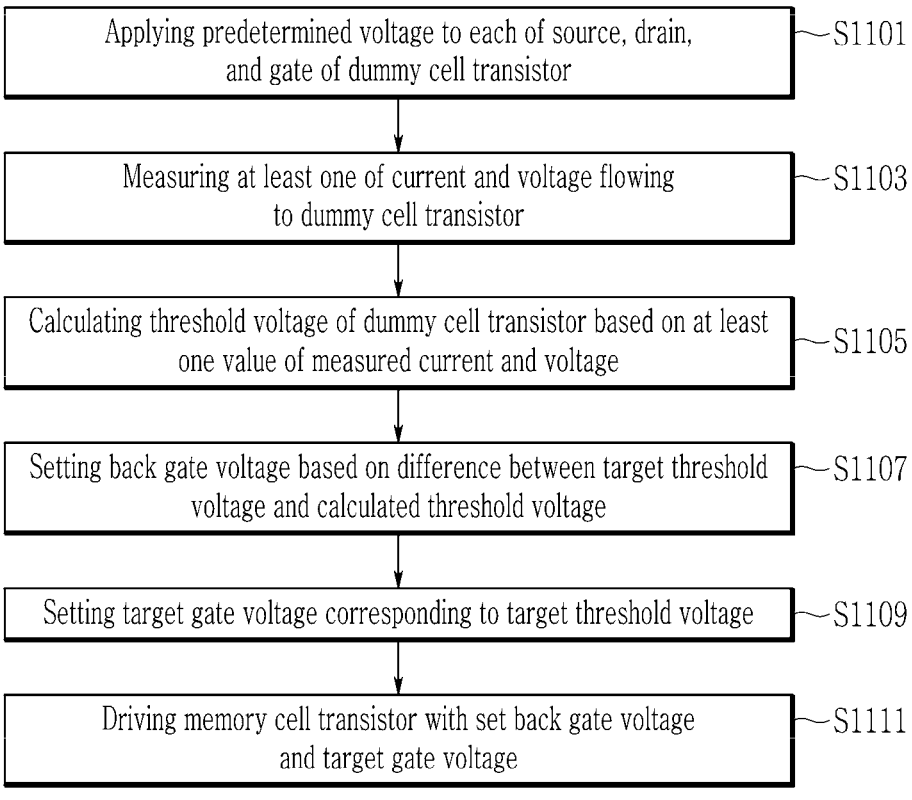

Applying predetermined voltage to each of source, drain, and gate of dummy cell transistor ~S1101

Measuring at least one of current and voltage flowing to dummy cell transistor ~S1103

Calculating threshold voltage of dummy cell transistor based on at least one value of measured current and voltage ~S1105

Setting back gate voltage based on difference between target threshold voltage and calculated threshold voltage ~S1107

Setting target gate voltage corresponding to target threshold voltage ~S1109

Driving memory cell transistor with set back gate voltage and target gate voltage ~S1111

MEMORY DEVICE AND OPERATING METHOD THEREOF FOR APPLYING VOLTAGE TO TRANSISTOR BASED ON OUTPUT OF MEMORY CELL

CROSS-REFERENCE TO RELATED APPLICATION(S)

This application claims the benefit of and priority under 35 U.S.C. § 119 to Korean Patent Application No. 10-2023-0026759 filed in the Korean Intellectual Property Office on Feb. 28, 2023, the entire contents of which are incorporated herein by reference.

BACKGROUND

(a) Field

The present disclosure relates to a memory device and an operation method of the memory device.

(b) Description of the Related Art

Recently, in order to obtain high performance, high speed, and economic efficiency, semiconductor devices are being highly integrated. Particularly in a case of a semiconductor device including unit cells composed of one transistor and one capacitor, since a data is recorded by storing or not storing charges in the capacitor, a high degree of the integration is required to form a high-capacity capacitor.

On the other hand, as the semiconductor device becomes more integrated, various problems in the operation of the device may occur. For example, in the case of the semiconductor device having a vertical-type transistor, since the distance between the transistors is further reduced, the body of the transistor does not have a constant voltage value, so a floating body effect in which the threshold voltage of the transistor fluctuates may occur more easily.

SUMMARY

The present disclosure, as manifested in one or more embodiments, is directed to monitoring and compensating for a threshold voltage change in a memory device.

A memory device according to an embodiment may include: a first cell including a first transistor and a capacitor connected to the first transistor and configured to store a voltage corresponding to data; a second cell including a second transistor; a voltage generation circuit configured to apply voltages to the source, gate, and drain of the second transistor and to the gate and back gate of the first transistor; a measuring circuit connected to the second cell, the measuring circuit configured to measure at least one of a current and a voltage output from the second cell, and to generate a leakage value based on at least one value of the measured current and voltage; and a monitoring circuit connected to the measuring circuit and configured to calculate a threshold voltage of the second transistor based on the leakage value, and to generate a control signal for controlling the voltage generation circuit based on the threshold voltage.

A driving method of a memory device according to an embodiment includes: applying a predetermined voltage to a source, a drain, and a gate of a first transistor; measuring at least one of a current flowing in and a voltage applied to the first transistor; calculating a threshold voltage of the first transistor based on at least one value of the measured current and voltage associated with the first transistor; and setting a back gate voltage applied to a back gate of a second transistor based on a difference between the applied predetermined voltage and the calculated threshold voltage of the first transistor.

A memory system according to an embodiment includes: a memory device including a first cell including a first transistor and a capacitor connected to the first transistor and configured to store a voltage corresponding to data, and a second cell including a second transistor; and a memory controller configured to provide an external voltage to the memory device, wherein the memory device may be configured to apply a voltage to the second transistor according to a predetermined voltage condition based on the external voltage, and to set the voltage applied to the first transistor based on at least one of the current and the voltage output from the second cell.

BRIEF DESCRIPTION OF THE DRAWINGS

Illustrative, non-limiting example embodiments will be more clearly understood from the following detailed description taken in conjunction with the accompanying drawings, wherein like reference numerals (when used) indicate corresponding elements throughout the several views, and in which:

FIG. 4 is a view showing a dummy cell array, a measuring circuit, a monitoring circuit, and a voltage generation circuit according to an embodiment.

FIG. 5 is a view showing a dummy cell array, a measuring circuit, monitoring circuit, and a voltage generation circuit according to an embodiment.

FIG. 6 is a view showing a dummy cell array, a measuring circuit, and a monitoring circuit according to another embodiment.

FIG. 11 is a flowchart showing an operation method of a memory device according to an embodiment.

DETAILED DESCRIPTION

Figure 1:
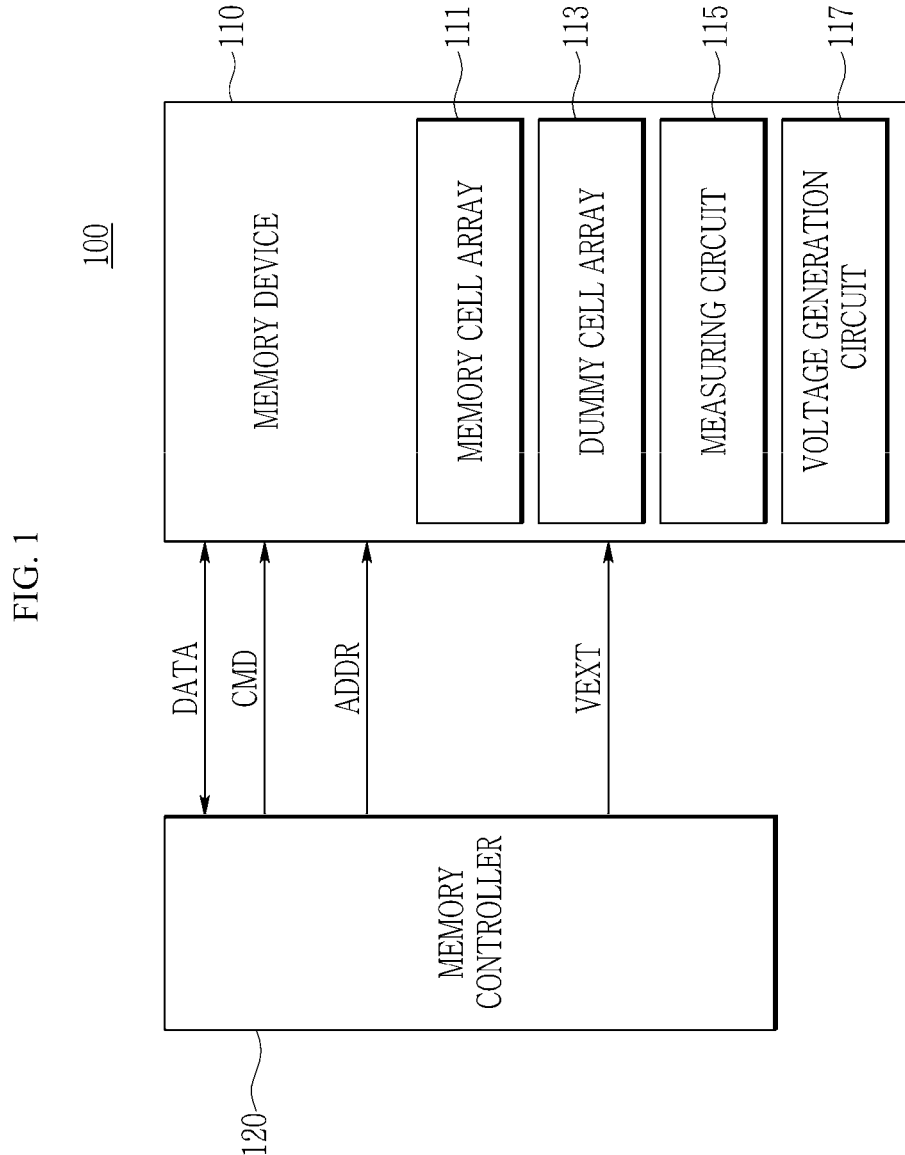
FIG. 1 is a view showing a memory system according to an embodiment.

In the following detailed description, only certain embodiments of the present invention have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive. Like reference numerals designate like elements throughout the specification. In a flowchart described with reference to the drawings, an order of operations may be changed, several operations may be merged, some operations may be divided, and specific operations may not be performed.

In addition, expressions written in the singular may be construed in the singular or plural unless an explicit expression such as "one" or "single" is used. Terms including ordinal numbers such as first, second, and the like will be used only to describe various components, and are not to be interpreted as limiting these components. These terms may be used for the purpose of distinguishing one constituent element from other constituent elements and are not intended to convey a particular ordering of the elements.

FIG. 1 is a block diagram showing at least a portion of an example memory system 100, according to one or more embodiments.

Referring to FIG. 1, the memory system 100 may include a memory device 110 and a memory controller 120 operatively coupled to the memory device 110. In some embodiments, the memory device 110 and the memory controller 120 may be connected through a memory interface (not explicitly shown, but implied) to send and receive signals through the memory interface.

The memory device 110 may be a storage device based on a semiconductor device. In some embodiments, the memory device 110 may be a phase change random access memory (PRAM) comprising resistive memory cells, but it may also be a resistive random access memory (RRAM), a magnetic random access memory (MRAM), and a ferroelectric random access memory (FRAM). In another embodiment, the memory device 110 may be a dynamic random access (DRAM) comprising dynamic memory cells.

The memory device 110 may include a memory cell array 111, a dummy cell array 113, a measuring circuit 115, and a voltage generation circuit 117.

The memory cell array 111 may include a plurality of memory cells arranged into a plurality of rows and a plurality of columns. In some embodiments, rows may be defined by word lines and columns may be defined by bit lines, with each of at least a subset of the memory cells in the memory cell array 111 being accessed (e.g., for reading and/or writing) using a unique pair of a bit line and a word line.

The dummy cell array 113 may include a plurality of dummy cells arranged into a plurality of rows and a plurality of columns, for example in a manner consistent with the arrangement of the memory cell array 111. In some embodiments, rows may be defined by word lines and columns may be defined by bit lines.

The measuring circuit 115 may be connected to the dummy cell array 113 and configured to measure the current output from the dummy cell array 113. The measuring circuit 115 may be connected to the dummy cell array 113 and may also measure the voltage of the dummy cell array 113. The measuring circuit 115 may be configured to generate a measuring value as a function of the measured current output and/or measured voltage of the dummy cell array 113.

The voltage generation circuit 117 may generate voltages applied to the memory cell array 111 and/or the dummy cell array 113. In some embodiments, the voltage generation circuit 117 may generate voltages applied to the memory cell array 111 and/or the dummy cell array 113 based on the measuring value generated by the measuring circuit 115.

The memory controller 120 may be configured to control the operation of the memory device 110 by providing one or more signals to the memory device 110. The signals may include an instruction or command (CMD) and an address (ADDR). In some embodiments, the memory controller 120 may provide the instruction (CMD) and the addresses (ADDR) to the memory device 110 to access the memory cell array 111 and control the memory operation such as reading or writing. Data DATA may be transferred from the memory cell array 111 to the memory controller 120 according to a reading operation, and data DATA may be transferred from the memory controller 120 to the memory cell array 111 according to a writing operation.

The instruction (CMD) may include an activation instruction and a reading/writing instruction. The activation instruction may be an instruction that converts a target row of the memory cell array 111 into an activation state (i.e., selects one or more memory cells in the memory cell array 111) in order to write data to the memory cell array 111 or read data from the memory cell array 111. In response to the activation instruction, the memory cell of the target row may be activated (e.g. driven). The reading/writing instruction may be an instruction for performing a reading or writing operation in the target memory cell of the row converted to the activation state.

Also, the memory controller 120 may provide an external voltage VEXT to the memory device 110. In some embodiments, the voltage generation circuit 117 may generate a voltage applied to the memory cell array 111 based on the external voltage VEXT.

In some embodiments, the memory controller 120 may access the memory device 110 upon a request from a host external to the memory system 100. The memory controller 120 may communicate with the host by using various protocols.

Figure 2:
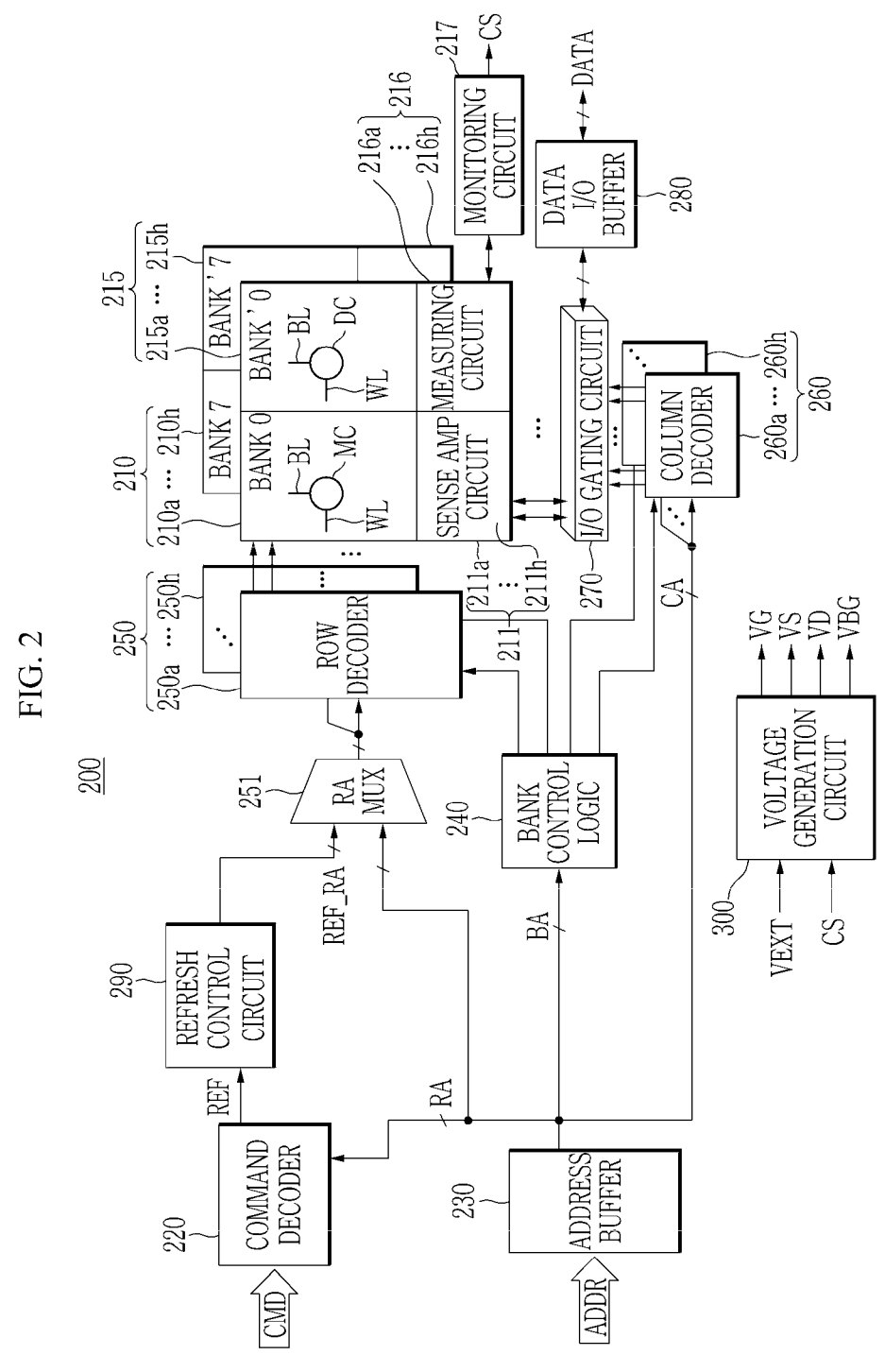
FIG. 2 is a block diagram showing a memory device according to an embodiment.

FIG. 2 is a block diagram showing at least a portion of an example memory device 200, according to one or more embodiments.

Referring to FIG. 2, the memory device 200 may include a memory cell array 210, a dummy cell array 215, a sense amplifier (amp) circuit 211, a measuring circuit 216, a monitoring circuit 217, a command decoder 220, an address buffer 230, a row decoder 250, a column decoder 260, an input and output (I/O) gating circuit 270, a data I/O buffer 280, and a refresh control circuit 290.

The memory cell array 210 may include a plurality of memory cells MC. In some embodiments, the memory cell array 210 may include a plurality of memory banks 210a to 210h. FIG. 2 shows eight memory banks BANK0-BANK7 (210a to 210h), but the number of the memory banks is not limited thereto. Each of the memory banks 210a to 210h may include a plurality of rows, a plurality of columns, and a plurality of memory cells MC arranged at intersections of the plurality of rows and the plurality of columns; that is, each memory cell MC may be located at a unique intersection of a corresponding row and column in the memory cell array 210. The memory cell MC may include one transistor and one capacitor. In some embodiments, a plurality of rows may be defined by a corresponding plurality of word lines WL, and a plurality of columns may be defined by a corresponding plurality of bit lines BL.

The dummy cell array 215 may include a plurality of dummy cells DC. In some embodiments, the dummy cell array 215 may include a plurality of dummy banks 215a to 215h. FIG. 2 shows eight dummy banks BANK'0-BANK'7 (215a to 215h), but the number of dummy banks is not limited thereto. Each dummy bank 215a to 215h may include a plurality of rows, a plurality of columns, and a plurality of dummy cells DCs arranged at intersections of the plurality of rows and a plurality of columns. The dummy cell DC may include one transistor. However, the present disclosure is not limited thereto, and the dummy cell DC may further include a capacitor. Hereinafter, for better understanding and ease of description, it is assumed that the dummy cell DC includes only one transistor. Hereinafter, the transistor of the memory cell MC is referred to as a memory cell transistor, and the transistor of the dummy cell DC is referred to as a dummy cell transistor. Unless otherwise noted, the cell transistor refers to a dummy cell transistor.

In FIG. 2, for better understanding and ease of description, a plurality of memory cells MC of the memory bank 210a and a plurality of dummy cells DC of the dummy bank 215a are shown as being positioned together in one cell array, but it is to be appreciated that a plurality of memory cells MC and a plurality of dummy cells DC may each form a separate cell array. Accordingly, a plurality of memory cells MC and a plurality of dummy cells DC may be connected to different word lines WL and different bit lines BL.

The command decoder 220 may generate a control signal so that the memory device 200 performs the reading operation, the writing operation, or the refresh operation. The command decoder 220 may generate a refresh instruction REF by decoding the instruction CMD received from the memory controller (e.g., 120 of FIG. 1).

The address buffer 230 may receive the address ADDR provided from the memory controller 120. The address ADDR may include a row address RA portion indicating a row of the memory cell array 210 and a column address CA portion indicating a column of the memory cell array 210. The row address RA is provided to the row decoder 250, and the column address CA is provided to the column decoder 260. The row address RA may be provided to the refresh control circuit 290 through the command decoder 220 or directly provided to the refresh control circuit 290. In some embodiments, the memory device 200 may further include a row address multiplexer (RA MUX) 251, and the row address RA may be provided to the row decoder 250 through the row address multiplexer 251. In some embodiments, the address ADDR may further include a bank address BA indicating a memory bank.

The row address multiplexer 251 may receive the row address RA from the address buffer 230 and the row address REF_RA to be refreshed from the refresh control circuit 290. The row address multiplexer 251 may selectively output the row address RA received from the address buffer 230 and the row address REF_RA received from the refresh control circuit 290 to the row decoder 250.

The row decoder 250 may select the row to be activated from a plurality of rows of the memory cell array 210 based on the row address (RA or REF_RA). Also, the row decoder 250 may select the row to be activated from a plurality of rows of the dummy cell array 215 based on the row address RA. To this end, the row decoder 250 may apply a driving voltage to the word line WL corresponding to the row to be activated (i.e., selected). In some embodiments, a plurality of row decoders 250a to 250h respectively corresponding to a plurality of memory banks 210a to 210h may be provided.

The column decoder 260 may select the column to be activated from a plurality of columns of the memory cell array 210 based on the column address. To this end, the column decoder 260 may activate the sense amp circuit 211 corresponding to the column address CA through the I/O gating circuit 270. In some embodiments, a plurality of column decoders 260a to 260h respectively corresponding to a plurality of memory banks 210a to 210h may be provided.

In some embodiments, the I/O gating circuit 270 may be configured to gate input and output data and may include a data latch for storing the data read from the memory cell array 210 and a write driver for writing the data to the memory cell array 210. The data read from the memory cell array 210 may be sensed by the sense amplifier circuit 211 and stored in the I/O gating circuit (270, for example, a data latch). In some embodiments, a plurality of sense amplifier circuits 211a to 211h respectively corresponding to the plurality of memory banks 210a to 210h may be provided.

In some embodiments, the memory device 200 may further include a bank control logic 240 configured to generate a bank control signal in response to the bank address BA. In response to the bank control signal, the row decoder 250 corresponding to the bank address BA among a plurality of row decoders 250a to 250h may be activated, and the column decoder 260 corresponding to the bank address BA among a plurality of column decoders 260a to 260h may be activated.

In some embodiments, the data read from the memory cell array 210 (e.g., the data stored in the data latch) may be provided to the memory controller 120 (FIG. 1) through the data I/O buffer 280. The data to be written in the memory cell array 210 may be provided to the data I/O buffer 280 from the memory controller 120, and the data provided to the data I/O buffer 280 may be provided to the I/O gating circuit 270.

The measuring circuit 216 may be configured to measure the current output from the dummy cell array 215. In some embodiments, the measuring circuit 216 may be connected to the dummy cell transistor in the dummy cell DC. The measuring circuit 216 may transfer the measured current value of the dummy cell transistor to the monitoring circuit 217. In some embodiments, the current of the dummy cell transistor may be one of the current flowing from a source of the dummy cell transistor to a drain of the dummy cell transistor, or the current flowing from the drain of the dummy cell transistor to the source, or the current output from the gate of the dummy cell transistor.

The monitoring circuit 217 may generate a control signal CS based on the current value measured by the measuring circuit 216 and may transmit the control signal CS to a voltage generation circuit 300 in the memory device 200. In some embodiments, the monitoring circuit 217 may generate the control signal CS based on the current value output from the dummy cell array 215.

The voltage generation circuit 300 may generate internal voltages having different levels based on the control signal CS from the monitoring circuit 217 and the external voltage VEXT applied from the memory controller 120 (FIG. 1). In some embodiments, the internal voltage may include a gate voltage VG, a source voltage VS, a drain voltage VD, and a back gate (i.e., bulk) voltage VBG. The voltage generation circuit 300 may provide the generated internal voltages to the memory cell array 210 and the dummy cell array 215.

The voltage generation circuit 300, the measuring circuit 216, and the monitoring circuit 217 may be disposed to a peripheral region of a substrate on which the memory device 200 is formed. In some embodiments, in the memory device 200, the command decoder 220, the address buffer 230, the data input and output buffer 280, and the like may also be disposed in the peripheral area of the substrate.

Figure 3:
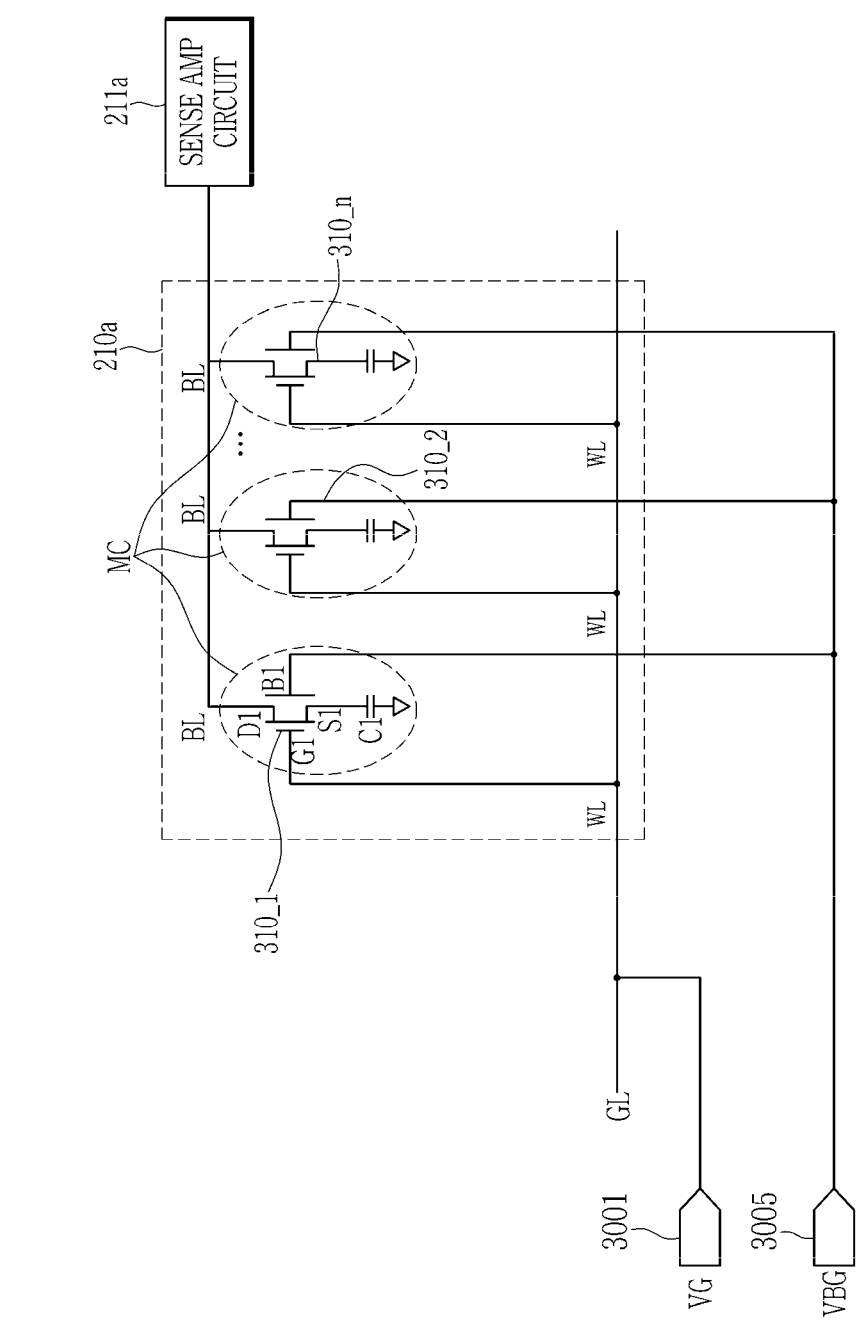
FIG. 3 is a view showing a memory cell array according to an embodiment.

FIG. 3 is a schematic diagram showing at least a portion of an example memory cell array, according to one or more embodiments.

In the following, a memory bank 210a among the plurality of memory banks in the memory cell array 210 (see FIG. 2) will be described as an example. Hereinafter, the description of the memory bank 210a may be equally applied to each of the plurality of memory banks (e.g., memory banks 210a to 210h).

As shown in FIG. 3, the memory bank 210a may include a plurality of memory cells MC connected to the word lines WL and the bit lines BL. In FIG. 3, one memory cell MC is shown as including one transistor and one capacitor, but the structure of the memory cell MC is not limited thereto.

In some embodiments, a plurality of memory cells MC may include memory cell transistors 310_1, 310_2, ..., 310_n, where n is an integer greater than one. In the following, the memory cell transistor 310_1 among a plurality of memory cell transistors 310_1, 310_2, ..., 310_n will be described as an example. Hereinafter, the description of the memory cell transistor 310_1 may be equally applied to each of the plurality of memory cell transistors 310_1, 310_2, ..., 310_n.

The gate voltage VG may be applied to a gate G1 of the memory cell transistor 310_1. The gate voltage VG may be provided with a level at which the memory cell transistor 310_1 is turned on (e.g., equal to or greater than a threshold voltage of the transistor) or a level at which the memory cell transistor 310_1 is turned off (e.g., less than a threshold voltage of the transistor). The gate G1 of the memory cell transistor 310_1 may be connected to the word line WL. The word line WL may be connected to a gate voltage application pin 3001. In some embodiments, the gate G1 of the memory cell transistor 310_1 may be connected to the gate voltage application pin 3001 through the word line WL. The gate voltage VG may be applied to the gate G1 of the memory cell transistor 310_1 through the gate voltage application pin 3001. Meanwhile, FIG. 3 shows that the gate voltage application pin 3001 is connected to the gate G1 of the memory cell transistor 310_1 through the word line WL, but the present disclosure is not limited thereto, and the gate voltage application pin 3001 may be connected to the gate G1 of the memory cell transistor 310_1 through a connection other than the word line WL.

A first terminal of the capacitor C1 may be connected to the source S1 of the memory cell transistor 310_1, and a second terminal of the capacitor C1 may be connected to ground (or another voltage source). A voltage corresponding to a data 1 or a data 0 logic state (i.e., data) may be stored in the capacitor C1.

A sense amplifier circuit 211a may be connected to the drain D1 of the memory cell transistor 310_1.

Based on the difference between the gate voltage VG applied to the memory cell transistor 310_1 and the voltage applied to the source S1 of the memory cell transistor 310_1, the memory cell transistor 310_1 may be turned off or turned on. For example, the on-off state of the memory cell transistor 310_1 may be controlled according to the gate voltage VG and the voltage stored in the capacitor C1.

Meanwhile, the back gate voltage VBG may be applied to the back gate (i.e., bulk) B1 of the memory cell transistor 310_1. The back gate B1 of the memory cell transistor 310_1 may be connected to the back gates of other memory cell transistors 310_2, ..., 310_n. The back gate voltage VBG may be applied to the back gate B1 of the memory cell transistor 310_1 through the back gate voltage application pin 3005.

In some embodiments, the threshold voltage of the memory cell transistor 310_1 may be increased by applying the back gate voltage VBG to the memory cell transistor 310_1. For example, the threshold voltage of the memory cell transistor 310_1 when the back gate voltage VBG is applied may be greater than the threshold voltage of the memory cell transistor 310_1 when the back gate voltage VBG is not applied. That is, the gate voltage VG for driving the memory cell transistor 310_1 when the back gate voltage VBG is applied may be greater than the gate voltage VG for driving the memory cell transistor 310_1 when the back gate voltage VBG is not applied.

On the other hand, as described later, the voltage generation circuit (300 in FIG. 2) may generate the gate voltage VG and the back gate voltage VBG applied to the memory bank 210a by the control signal CS generated by the measuring circuit (216 of FIG. 2) and the monitoring circuit (217 of FIG. 2) connected to the dummy bank (215a of FIG. 2). In some embodiments, the voltage generation circuit (300 of FIG. 2) may generate the gate voltage VG based on the threshold voltage.

Figure 4:
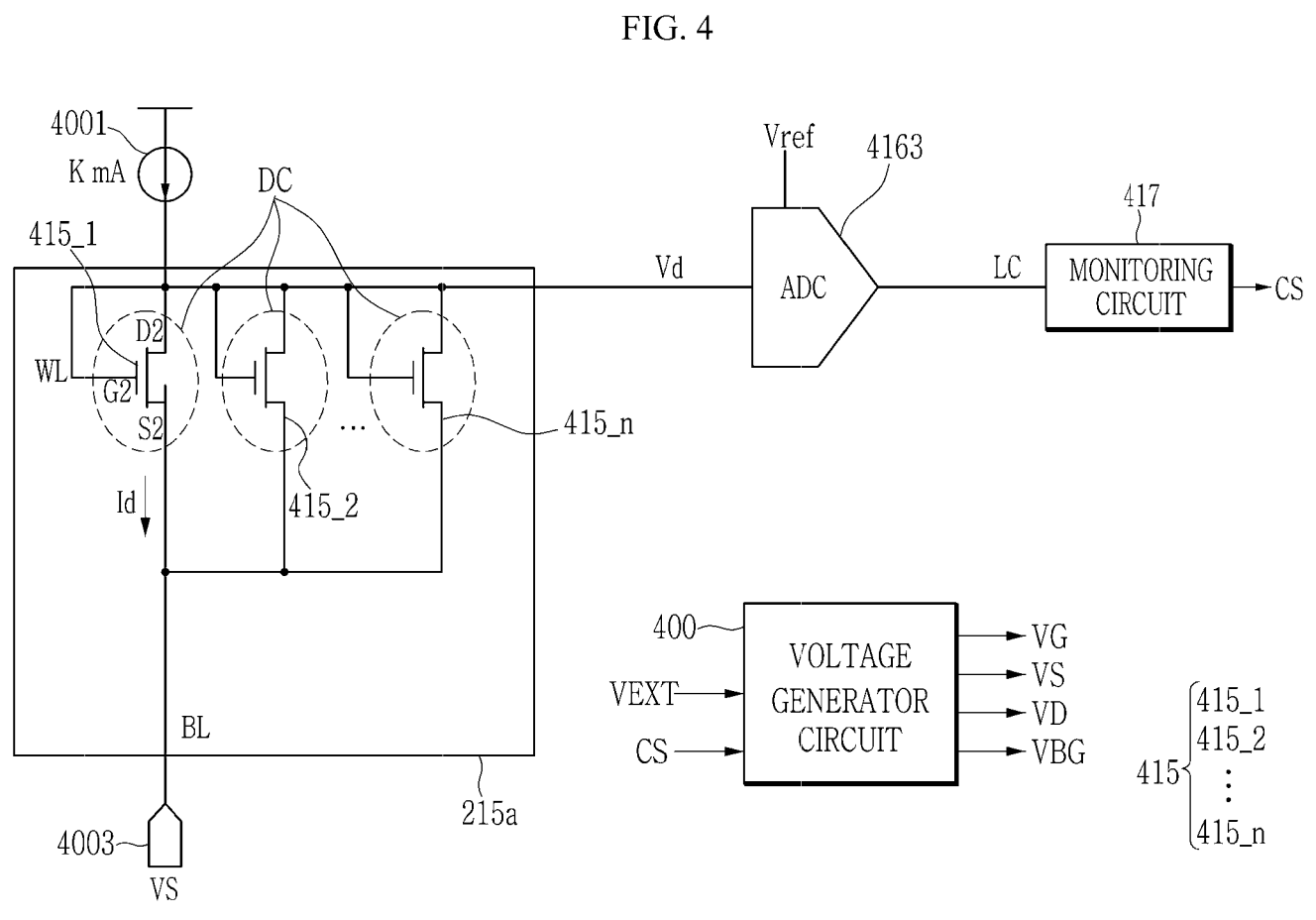

FIG. 4 is a schematic diagram showing at least a portion of an example dummy cell array, a measuring circuit, a monitoring circuit, and a voltage generation circuit, according to one or more embodiments. Specifically, FIG. 4 may be a circuit for measuring the threshold voltage of the dummy cell array.

In the following, a dummy bank 215a among the plurality of dummy banks (215a through 215h) in the dummy cell array 215 (FIG. 2) will be described as an example. Hereinafter, the description of the dummy bank 215a will be representative of and may be equally applied to each of the plurality of dummy banks in the dummy cell array 215 (FIG. 2).

As shown in FIG. 4, the dummy bank 215a may include a plurality of dummy cells DC connected to a word line WL and a bit line BL. In FIG. 4, one dummy cell DC is shown as including one transistor, but the structure of the dummy cell DC is not limited thereto.

In some embodiments, each of a plurality of dummy cells DC may include a corresponding dummy cell transistor 415_1, 415_2, ..., 415_n. In the following, the dummy cell transistor 415_1 among the plurality of dummy cell transistors 415_1, 415_2, ..., 415_n will be described as an example. Hereinafter, the description of the dummy cell transistor 415_1 may be equally applied to each of the plurality of dummy cell transistors 415_1, 415_2, ..., 415_n.

Specifically, a current source 4001 may be connected to a plurality of drains D2 of the plurality of dummy cells transistor 415_1 through 415_n in the dummy bank 215a. The current source 4001 may generate a prescribed current, K mA. In this case, K may be any number.

Each gate G2 of the plurality of dummy cell transistors 415_1, 415_2, and 415_n may be connected to each drain D2 of a plurality of dummy cell transistors 415_1, 415_2, ..., and 415_n. Each source S2 of the plurality of dummy cells transistors 415_1, 415_2, and 415_n may be connected to the bit line BL. A source voltage VS may be applied to the source S2 of each of the plurality of dummy cell transistors 415_1, 415_2, ..., 415_n through a source terminal pin 4003.

An analog digital converter (ADC) 4163 may be connected to the drain D2 of the dummy cell transistor 415_1 in the dummy cell array 415, and measure the drain voltage VD applied to the drain D2 of the dummy cell transistor 415_1. The ADC 4163 may generate a leakage value LC by digitizing the drain voltage VD (as a function of the drain voltage VD and a reference voltage Vref supplied to the ADC 4163.

A monitoring circuit 417 may calculate the threshold voltage of the dummy cell transistor 415_1 based on the leakage value LC received from the ADC 4163 and generate a control signal CS for controlling a voltage generation circuit 400 based on the threshold voltage.

In some embodiments, the monitoring circuit 417 may calculate the threshold voltage based on Equation 1 below.

$$Id = \mu n \frac{\varepsilon ox}{tox} \frac{W}{L} \left[ (Vgs - Vth)Vds - \frac{1}{2}Vds^2 \right] = \quad \text{(Equation 1)}$$

$$\mu n \frac{\varepsilon ox}{tox} \frac{W}{L} [(Vgs - Vth)Vds]$$

(Here, $\mu_n$=an electron mobility [cm$^2$/V·s], $\varepsilon_{ox}$=a dielectric constant of an oxide layer of a transistor, $t_{ox}$=thickness [cm] of an oxide layer of a transistor, W=a width [cm] of a source and a drain of a channel of a transistor, and L=a length [cm] between a source and a drain of a channel of a transistor).

Since $\mu_n$ is a constant value, and $\varepsilon_{ox}$, $t_{ox}$, W, L are values predetermined in a design of the dummy cell transistor 415_1, the monitoring circuit 417 may calculate the threshold voltage Vth based on the leakage value LC of the gate-source voltage Vgs, the drain-source voltage Vds, and the drain current Id applied to the dummy cell transistor 415_1.

Here, the drain current Id may be the same as the current flowing through the drain D2 of the dummy cell transistor 415_1 by the current source 4001. For example, the drain current Id may be a value obtained by dividing the current (K mA) applied by the current source 4001 by the number of the dummy cell transistors 415 (e.g., n). Also, since the gate G2 and the drain D2 of the dummy cell transistor 415_1 are connected together, the gate-source voltage Vgs and the drain-source voltage Vds may be the same.

The monitoring circuit 417 may calculate the threshold voltage of the dummy cell transistor 415_1 based on the drain voltage VD measured by the ADC 4163, the current value supplied by the current source 4001, and the source voltage VS applied to the source S2 through the source terminal pin 4003.

The monitoring circuit 417 may generate the control signal CS based on the calculated threshold voltage. The voltage generation circuit 400 may generate the gate voltage VG and the back gate voltage VBG applied to the memory cell array (210 of FIG. 2) based on the control signal CS and the external voltage VEXT.

In some embodiments, if there is a difference between the threshold voltage determined by the monitoring circuit 417 and a target threshold voltage intended in the design of the dummy cell transistor 415_1 (e.g., as may be calculated using Equation 1 above), the monitoring circuit 417 may generate the control signal CS for controlling the voltage generation circuit 400 to apply the back gate voltage VBG to the back gate of the memory cell transistor (310 in FIG. 3) based on the difference. For example, if the threshold voltage determined by the monitoring circuit 417 is lower than the target threshold voltage intended in the design of the dummy cell transistor 415_1, the monitoring circuit 417 may generate the control signal CS that controls the voltage generation circuit 400 to apply the higher back gate voltage VBG.

In some embodiments, the monitoring circuit 417 may generate the control signal CS that controls the voltage generation circuit 400 to apply the gate voltage VG within a certain range based on the target threshold voltage. For example, the monitoring circuit 417 may generate the control signal CS to set a voltage lower than the threshold voltage by a first voltage as the turn-off voltage of the dummy cell transistor and a voltage higher than the threshold voltage by a second voltage as the turn-on voltage of the dummy cell transistor. At this time, the first voltage and the second voltage may be set in advance. In some embodiments, the first voltage may be 1 V, and the second voltage may be 1.5 V. For example, if the threshold voltage calculated by the monitoring circuit 417 is −0.5 V, the turn-off voltage of the dummy cell transistor may be −1.5 V (i.e., lower than the threshold voltage by 1 V), and the turn-on voltage of the dummy cell transistor may be 1 V (i.e., higher than the threshold voltage by 1.5 V). However, the present disclosure is not limited thereto, and the monitoring circuit 417 may control the voltage generation circuit 400 so that the gate voltage VG is positioned within a predetermined range with reference to the threshold voltage.

Figure 5:
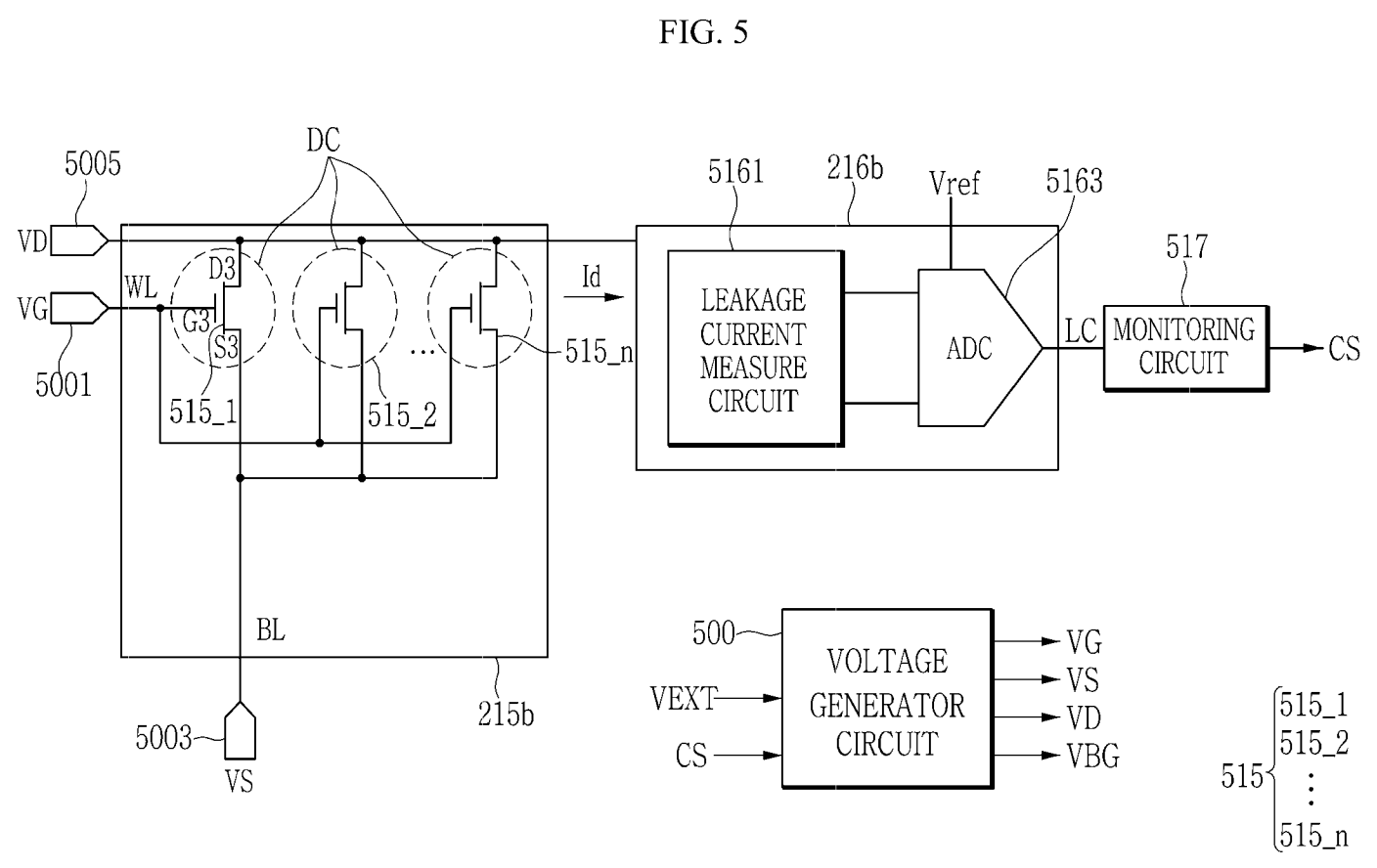

FIG. 5 is a schematic diagram showing at least a portion of an example dummy cell array, a measuring circuit, a monitoring circuit, and a voltage generation circuit, according to one or more embodiments.

In the following, a dummy bank 215b among the plurality of dummy banks (215a through 215h in FIG. 2) in the dummy cell array 215 and a measuring circuit 216b of the plurality of measuring circuits 216 (FIG. 2) will be described as examples. Hereinafter, the description of the dummy bank 215b and the measuring circuit 216b may be representative of and equally applied to each of the plurality of dummy banks 215 and each of the plurality of measuring circuits 216 (see FIG. 2).

In addition, in the following, a dummy cell transistor 515_1 among a plurality of dummy cell transistors 515_1, 515_2, . . . , 516_n will be described as an example. Hereinafter, the description of the dummy cell transistor 515_1 may be equally applied to each of the plurality of dummy cell transistors (515_1, 515_2, . . . , 515_n).

As shown in FIG. 5, the dummy bank 215b may include a plurality of dummy cells (DC of FIG. 2). The dummy cell DC may include a dummy cell transistor 515_1 connected to the word line WL and the bit line BL. Although not explicitly shown in FIG. 5, the dummy bank 215b may include various elements other than the dummy cell transistors 515.

A gate voltage VG may be applied to the gate G3 of the dummy cell transistor 515_1. The gate voltage VG may be provided with a level at which the dummy cell transistor 515_1 is turned on or a level at which the dummy cell transistor 515_1 is turned off. The gate G3 of the dummy cell transistor 515_1 may be connected to the word line WL. The word line WL may be connected to a gate voltage application pin 5001. In some embodiments, the gate G3 of the dummy cell transistor 515_1 may be connected to the gate voltage application pin 5001 through the word line WL. The gate voltage VG may be applied to the gate G3 of the dummy cell transistor 515_1 through the gate voltage application pin 5001. Meanwhile, in FIG. 5, the gate voltage application pin 5001 is shown as being connected to the gate G3 of the dummy cell transistor 515_1 through the word line WL, but the present disclosure is not limited thereto, and the gate voltage application pin 5001 may be connected to the gate G3 of the dummy cell transistor 515_1 through a connection other than the word line WL.

A source voltage VS may be applied to the source S3 of the dummy cell transistor 515_1. The source S3 of the dummy cell transistor 515_1 may be connected to the sources of other dummy cell transistors 515_2, . . . , 515_n. Meanwhile, in FIG. 5, a source voltage application pin 5003 is shown as being connected to the source S3 of the dummy cell transistor 515_1 through the bit line BL, but the present disclosure is but is not limited thereto. For example, the source voltage application pin 5003 may be connected to the dummy cell transistor 515_1 through another connection means.

Based on the difference between the gate voltage VG and the source voltage VS applied to the dummy cell transistor 515_1, the dummy cell transistor 515_1 may be turned off or turned on. For example, the source voltage VS having a fixed value may be applied to the source S3, and the on/off state of the dummy cell transistor 515_1 may be controlled by controlling the gate voltage VG.

A drain voltage VD may be applied to drain D3 of the dummy cell transistor 515_1. The drain D3 of the dummy cell transistor 515_1 may be connected to the drains of other dummy cell transistors 515_2, . . . , 515_n. For example, a drain voltage application pin 5005 may be connected to the dummy cell transistor 515_1 through a connection line.

The measuring circuit 216b may be connected to the drains D3 of the plurality of dummy cells transistor 515 in the dummy bank 215b. The measuring circuit 216b may receive the current flowing from the dummy bank 215b to the dummy cell transistor 515_1 to generate a measuring value, and transmit the measuring value to a monitoring circuit 517.

In some embodiments, the gate voltage VG and the source voltage VS may have a specific value, and the drain D3 may have an arbitrary value. At this time, when the dummy cell transistor 515_1 is turned on due to the voltage difference between the gate voltage VG and the source voltage VS, the current flowing from the source S3 to the drain D3 or from the drain D3 to the source S3 is referred to as a dynamic leakage current.

When the voltage generation circuit 500 applies the source voltage VS, the gate voltage VG, and the drain voltage VD, which corresponds to a first voltage condition, the measuring circuit 216b may measure the drain current Id of the dummy cell transistor 515_1. At this time, the drain current Id measured by the measuring circuit 216b may be a dynamic leakage current. In some embodiments, the first voltage condition may include the source voltage VS corresponding to the first voltage, the gate voltage VG corresponding to a second voltage having a value higher than the first voltage, and a drain voltage VD having a third voltage higher than the second voltage. For example, the first voltage may be a ground voltage. When the gate-source voltage is higher than the threshold voltage of the dummy cell transistor 515_1, the dummy cell transistor 515_1 may be turned on. The monitoring circuit 517 may adjust the voltage applied to the dummy bank 215b by calculating the threshold voltage of the dummy cell transistor 515_1 based on the measured dynamic leakage current LC and generating the control signal CS.

In some embodiments, the gate voltage VG applied to the gate G3 of the dummy cell transistor 515_1 and the source voltage VS applied to the source S3 may have a specific value, and the drain D3 of the dummy cell transistor 515_1 may have an arbitrary value. At this time, when the dummy cell transistor 515_1 is turned off due to the voltage difference between the gate voltage VG and the source voltage VS (i.e., the gate-source voltage), the current flowing from the source S3 to the drain D3 or from the drain D3 to the source S3 may be referred to as a static leakage current.

When the voltage generation circuit 500 applies the source voltage VS, the gate voltage VG, and the drain voltage VD, which correspond to a second voltage condition, the measuring circuit 216b may measure the drain current Id. At this time, the source current Id measured by the measuring circuit 216b may be the static leakage current. In some embodiments, the second voltage condition may include the source voltage VS corresponding to the first voltage, the gate voltage VG corresponding to a second voltage having a value lower than the first voltage, and the drain voltage VD having a third voltage having a value higher than the first voltage. The monitoring circuit 517 may adjust the voltage applied to the dummy cell transistor 515_1 by calculating the threshold voltage of the dummy cell transistor 515_1 based on the measured static leakage current LC and generating the control signal CS.

Specifically, the measuring circuit 216b may include a leakage current measure circuit 5161 and an analog-digital converter 5163.

The leakage current measure circuit 5161 may be connected to a plurality of dummy cell transistors 515 in the dummy bank 215b.

In some embodiments, the leakage current measure circuit 5161 may measure the drain current Id output from a plurality of dummy cell transistors 515. For example, the drain current Id may be one of the dynamic leakage current and the static leakage current. The type of the drain current Id measured by the leakage current measure circuit 5161 may vary according to the voltage condition applied to the dummy bank 215b by the voltage generation circuit 500.

The leakage current measure circuit 5161 may transfer the measured current value to the ADC 5163. The current value measured by the leakage current measure circuit 5161 may be an analog value.

The ADC 5163 may be connected to leakage current measure circuit 5161. The ADC 5163 receives the current value measured by the leakage current measure circuit 5161 and may generate a digital value for the analog current value. The ADC 5163 may digitize the analog current value, as a function of a reference voltage Vref supplied to the ADC 5163, and output the leakage value LC. The ADC 5163 may transfer the leakage value LC to the monitoring circuit 517.

The monitoring circuit 517 may calculate the threshold voltage of the dummy cell transistor 515_1 based on the leakage value LC and generate the control signal CS.

Specifically, the monitoring circuit 517 may calculate the threshold voltage of the dummy cell transistor 515_1 based on the leakage value LC corresponding to the drain current Id and generate the control signal CS. The correlation between the gate-source voltage and the drain current Id may be preset. The monitoring circuit 517 may calculate the gate-source voltage based on the gate voltage VG and the source voltage VS applied by the voltage generation circuit 500, and calculate the threshold voltage of the dummy cell transistor 515_1 based on the gate-source voltage and the leakage value LC. Specifically, the monitoring circuit 517 may calculate the threshold voltage based on Equation 2 below.

$$Id = \mu_n \frac{\varepsilon_{ox}}{t_{ox}} \frac{W}{L}(Vgs - Vth) \cdot Vds \qquad \text{(Equation 2)}$$

(Here, $\mu_n$=an electron mobility [cm$^2$/V·s], $\varepsilon_{ox}$=a dielectric constant of an oxide layer of a transistor, $t_{ox}$=a thickness [cm] of an oxide layer of a transistor, W=a width [cm] of a channel between a source and a drain of a transistor, and L=a length [cm] of a channel between a source and a drain of a transistor.)

Since $\mu_n$ is a constant, and $\varepsilon_{ox}$, $t_{ox}$, W, L are values preset during the design of the dummy cell transistor 515_1, the monitoring circuit 217 may calculate the threshold voltage Vth based on the gate-source voltage Vgs and the drain-source voltage Vds applied to the dummy cell transistor, and the leakage value LC of the drain current Id.

In some embodiments, there may be a case where the threshold voltage calculated by the monitoring circuit 517 is different from the threshold voltage set during dummy cell transistor design due to an error in the process. The monitoring circuit 517 may generate the control signal CS for controlling the voltage generation circuit 500 so that the dummy cell transistor has a preset threshold voltage based on the difference between the preset threshold voltage and the calculated threshold voltage.

The voltage generation circuit 500 may generate the internal voltage applied to the dummy bank 215b and the memory cell array (210 of FIG. 2). Specifically, the voltage generation circuit 500 may generate the internal voltage based on the external voltage VEXT and the control signal CS of the monitoring circuit 517.

In some embodiments, the monitoring circuit 517 may generate the control signal CS so that the voltage generation circuit 500 generates a new back gate voltage. For example, the monitoring circuit 517 may generate the control signal CS so as to generate the back gate voltage having a value than higher the back gate voltage (VBG in FIG. 3) that is previously applied through the voltage generation circuit 500 in a case that the calculated threshold voltage has a value smaller than the preset threshold voltage. When the new back gate voltage applied to the memory cell transistor is greater than the back gate voltage VBG applied to the existing memory cell transistor, the threshold voltage of the memory cell transistor to which the new back gate voltage is applied may be increased compared to the threshold voltage of the memory cell transistor to which the existing back gate voltage VBG is applied.

In some embodiments, the monitoring circuit 517 may generate the control signal CS so that the voltage generation circuit 500 generates the new gate voltage. For example, the monitoring circuit 517 may generate the control signal CS so that the gate voltage VG is positioned within a predetermined range with the threshold voltage as a reference.

Similarly, the monitoring circuit 517 may generate the control signal CS so that the voltage generation circuit 500 generates a new source voltage and/or a new drain voltage.

Figure 6:
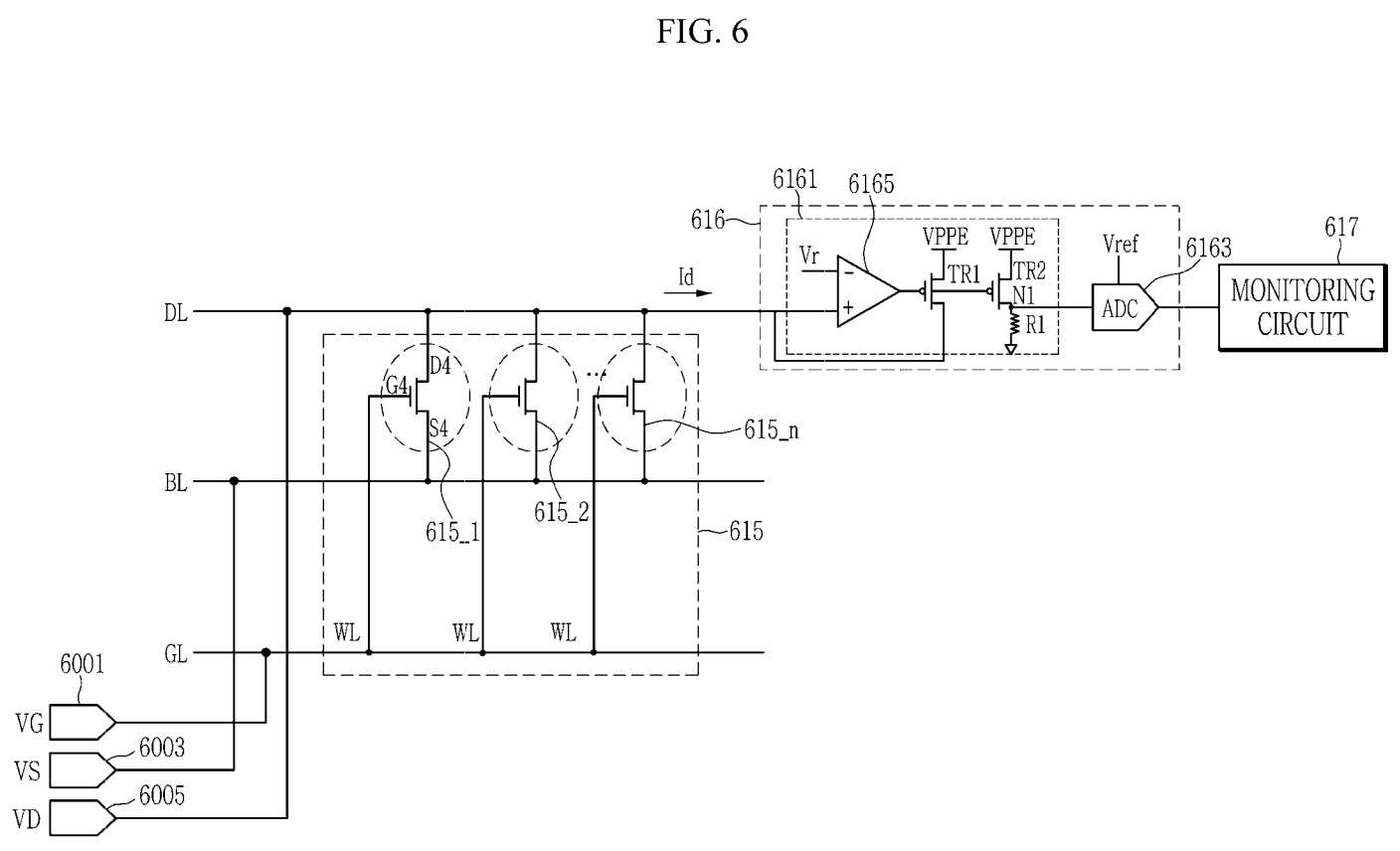

FIG. 6 is a schematic diagram showing at least a portion of a dummy cell array, a measuring circuit, and a monitoring circuit, according to another embodiment.

As shown in FIG. 6, gates G4 of a plurality of dummy cell transistors 615_1, 615_2, . . . , 615_n in a dummy cell array 615 may be connected to a common gate line GL via corresponding word lines WL or another connection means. Sources S4 of the plurality of dummy cell transistors 615_1, 615_2, . . . , 615_n may be connected to a common bit line BL. Drains D4 of the plurality of dummy cell transistors 615_1, 615_2, . . . , 615_n may be connected to a common drain line DL. The gate voltage VG may be applied to the gates G4 of the dummy cell transistors 615_1 through 615_n in the dummy cell array 615 through a gate terminal pin 6001, the source voltage VS may be applied to the sources S4 of the dummy cell transistors through a source terminal pin 6003, and the drain voltage VD may be applied to the drains D4 of the dummy cell transistors through a drain terminal pin 6005.

A measuring circuit 616 may be connected to the drain D4 of the dummy cell transistor 615_1 in the dummy cell array 615. The measuring circuit 616 may include a leakage current measure circuit 6161 and an ADC 6163. The leakage current measure circuit 6161 may include an operational amplifier 6165. The voltage of Vr may be applied to the inverting input terminal (−) of the operational amplifier 6165. At this time, Vr may be an arbitrary voltage. The voltage at the drains of the dummy cell transistors 615_1 through 615_n present on the drain line is supplied to the non-inverting input terminal (+) of the operational amplifier 6165. The operational amplifier 6165 will generate an output signal that is indicative of a comparison between the voltage Vr and the drain voltage of the dummy cell transistors 615_1 through 615_n.

The leakage current measure circuit 6161 may include a first transistor TR1 and a second transistor TR2 connected to the output terminal of the operational amplifier 6165. The first transistor TR1 and the second transistor TR2 may be a metal-oxide semiconductor field-effect transistor (MOSFET). In some embodiments, the first transistor TR1 and the second transistor TR2 may be an NMOS transistor or a PMOS transistor. One terminal of the first transistor TR1 (e.g., source) may be connected to the VPPE voltage source, and the other terminal (e.g., drain) may be connected to the drain line DL. One terminal of second transistor TR2 may be connected to the VPPE voltage source, and the other terminal may be connected to a resistor R1 at a first node N1. The other terminal of the resistor R1 may be connected to ground.

It is to be appreciated that, because a MOSFET device may be symmetrical by nature, and thus bidirectional, the assignment of source and drain designations in the MOSFET device is essentially arbitrary. Therefore, the source and drain of the MOSFET device (e.g., TR1 and TR2) may be referred to herein generally as first and second source/drain, respectively, where "source/drain" in this context denotes a source or a drain of the MOSFET device.

In some embodiments, when there is no leakage current output from the dummy cell array 615, the current may not flow through the drain D4 of the dummy cell transistor 615_1. Accordingly, voltages input to the inverting input terminal (−) and the non-inverting input terminal (+) of the operational amplifier 6165 may be the same. That is, the voltage of Vr may be applied to the drain line DL, by operation of the feedback connection arrangement of the operational amplifier 6165 and transistor TR1.

Meanwhile, when there is leakage current output from the dummy cell array 615, the leakage current may flow to the drain D4 of the dummy cell transistor 615_1. For example, the leakage current may flow from the drain D4 of the dummy cell transistor 615_1 to the source S4 direction. The amount of the current input to the operational amplifier 6165 may be reduced as much as the amount of the current reduced by the leakage current. The first transistor TR1 can reduce the voltage of the non-inverting input terminal of the operational amplifier 6165 by changing the current input to the non-inverting input terminal (+). Accordingly, the output voltage of the operational amplifier 6165 is reduced, and the first transistor TR1 may compensate for the voltage input to the non-inverting input terminal (+) of the operational amplifier 6165 by the reduced output voltage. Specifically, as the amount of the current input to the operational amplifier 6165 decreases, the voltage input to the gates of the first transistor TR1 and the second transistor TR2 may decrease. Accordingly, the current flowing in the first transistor TR1 may increase, which may be fed back to the non-inverting input terminal (+) of the operational amplifier 6165, and the voltage difference of the non-inverting input terminal (+) and the inverting input terminal (+) of the operational amplifier 6165 may be compensated. So, the voltage input to the non-inverting input terminal (+) of the operational amplifier 6165 may be maintained as Vr. The voltage input to the gate of the first transistor TR1 may vary based on the amount of leakage current output from the dummy cell array 615.

Similarly, the voltage input to the gate of the second transistor TR2 may vary based on the amount of the leakage current output from the dummy cell array 615. The voltage applied to the gate of the first transistor TR1 and the voltage applied to the gate of the second transistor TR2 may be the same, since the gates of transistors TR1 and TR2 are connected to the output of the operational amplifier 6165, and the sources of TR1 and TR2 are connected to voltage source VPPE (i.e., the gate-to-source voltage of transistors TR1 and TR2 may be the same). The current flowing through resistor R1 may vary according to the voltage applied to the gate of the second transistor TR2.

Depending on the current flowing to the resistor R1, the voltage applied to the first node N1 of the second transistor TR2 may be changed.

The voltage applied to the first node N1 may be supplied as an input to the ADC 6163. A reference voltage Vref may also be supplied as an input to the ADC 6163, which may be used by the ADC 6163 to generate a digitized version of the analog input voltage at node N1 as an output thereof.

A monitoring circuit 617 may predict the change of the threshold voltage of the dummy cell transistor 615_1 in the dummy cell array 615 based on the difference between the voltage value of the first node N1 in the case without a leakage current and the voltage value of the first node N1 in the case that there is a leakage current. The degree of variation of the threshold voltage according to the variation of the voltage value applied to the first node N1 may be set in advance.

The relationship between the gate-source voltage and the drain current (Id) required for the monitoring circuit 617 to calculate the threshold voltage will be described with reference to FIG. 7.

Figure 7:
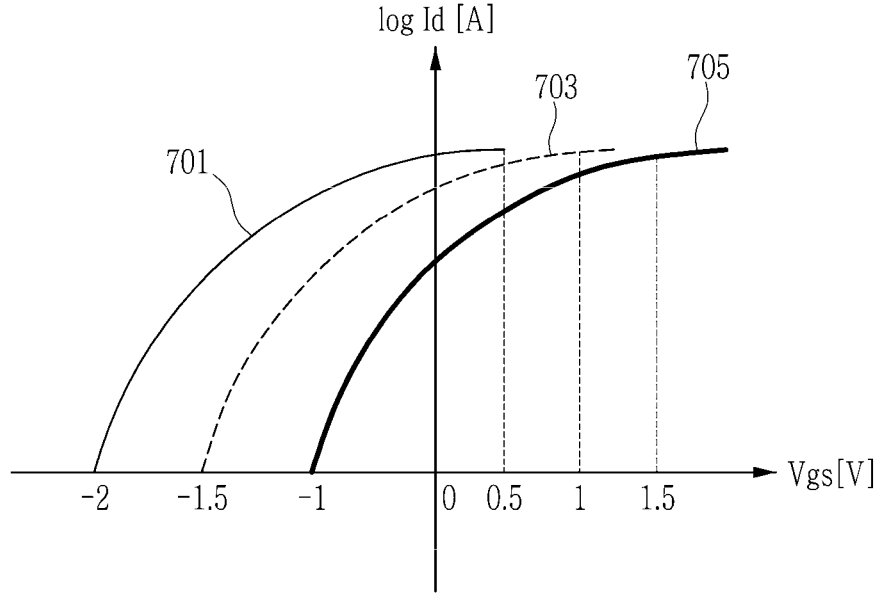
FIG. 7 is a view showing a relationship between a gate-source voltage and a drain current of a cell transistor according to an embodiment.

By way of example only and without loss of generality, FIG. 7 is a graph conceptually showing a relationship between a gate-source voltage and a drain current of a cell transistor according to an embodiment.

A first graph 701 depicts the change in the drain current Id of the dummy cell transistor as a function of the voltage Vgs of the gate-source of the first dummy transistor having the threshold voltage (Vth=−1 V) of −1 V. In some embodiments, the first dummy transistor may be an NMOS transistor.

As shown in FIG. 7, as the gate-source voltage Vgs applied to the first dummy transistor increases to −2 V or more, the value of the drain current Id flowing to the first dummy transistor may start to increase with an increasing function type (i.e., slope). When the gate-source voltage Vgs is 0.5 V, the drain current Id may have a maximum value. In other words, the first dummy transistor may be turned off when the gate-source voltage Vgs less than −2 V is applied. Also, when the gate-source voltage Vgs of −2 V to 0.5 V is applied, the drain current Id flowing between the source and the drain of the first dummy transistor may gradually increase. At this time, as the threshold voltage of the first dummy transistor is −1 V, the drain current Id flowing through the first dummy transistor when the voltage Vgs of the gate-source voltage has a value of −2V to −1V, can be a current caused by the leakage current of the first dummy transistor. Also, the first dummy transistor may be turned on when the gate-source voltage Vgs more than 0.5 V is applied. It is shown that the drain current Id does not flow to the first dummy transistor when the gate-source voltage Vgs is 0.5 V or more, but the present disclosure is not limited thereto, and when the gate-source voltage Vgs of 0.5 V or more flows, the drain current Id having an arbitrary value may flow to the first dummy transistor.

A second graph 703 is a graph showing the change in the drain current Id depending on the gate-source voltage Vgs of the second dummy transistor having the threshold voltage of −0.5 V (Vth=−0.5 V). In some embodiments, the second dummy transistor may be an NMOS transistor.

As shown in FIG. 7, as the gate-source voltage Vgs applied to the second dummy transistor increases to −1.5 V or higher, the value of the drain current Id flowing through the second dummy transistor may also increase in the form of an increasing function.

When the gate-source voltage Vgs is 1 V, the drain current Id may have a maximum value. In summary, the second dummy transistor may be turned off when the gate-source voltage Vgs of −1.5 V or less is applied. In addition, when the gate-source voltage Vgs of −1.5 V to 1 V is applied, the current flowing between the source and the drain of the second dummy transistor may gradually increase. At this time, as the threshold voltage of the second dummy transistor is −0.5 V, the drain current Id flowing through the second dummy transistor when the voltage Vgs of the gate-source voltage has a value of −1.5V to −0.5V, can be a current caused by the leakage current of the second dummy transistor. When the gate-source voltage Vgs of 1 V or higher is applied, the second dummy transistor may be turned on. Although it is shown that the drain current Id does not flow to the second dummy transistor when the gate-source voltage Vgs is 1 V or more, the present disclosure is not limited thereto, and the drain current Id having an arbitrary value may flow to the second dummy transistor when the gate-source voltage Vgs of 1 V or more is applied.

A third graph 705 is a graph showing a change in the drain current Id depending on the gate-source voltage Vgs of the third dummy transistor having a threshold voltage of 0 V (Vth=0 V). In some embodiments, the third dummy transistor may be an NMOS transistor.

As shown in FIG. 7, the drain current Id may flow to the third dummy transistor when the gate-source voltage Vgs of −1 V or higher is applied. As the gate-source voltage Vgs applied to the third dummy transistor increases, the value of the drain current Id flowing through the third dummy transistor may also increase in the form of an increasing function. When the gate-source voltage Vgs is 1.5 V, the drain current Id may have a maximum value. In summary, the third dummy transistor may be turned off when the gate-source voltage Vgs of −1 V or less is applied. In addition, when the gate-source voltage Vgs of −1 V to 1.5 V is applied, the current flowing between the source and the drain of the third dummy transistor may gradually increase. At this time, as the threshold voltage of the third dummy transistor is 0 V, the drain current Id flowing through the third dummy transistor when the voltage Vgs of the gate-source voltage has a value of −1V to 0V, can be a current caused by the leakage current of the third dummy transistor. When the gate-source voltage Vgs of 1.5 V or more is applied, the third dummy transistor may be turned on. Although it is shown that the drain current Id does not flow to the third dummy transistor when the gate-source voltage Vgs is 1.5 V or more, the present disclosure is not limited thereto, and when the gate-source voltage Vgs of 1.5 V or more is applied, the drain current Id with an arbitrarily value may flow to the third dummy transistor.

In summary, the relationship between the gate-source voltage and drain current of the dummy cell transistor may differ depending on the threshold voltage of the dummy cell transistor, and the monitoring circuit 617 may calculate the threshold voltage of the dummy cell transistor based on the graph of FIG. 7 or Equation 1. However, in some embodiments, each of the first to third dummy transistors may be one of the dummy transistors described in FIG. 6.

The monitoring circuit 617 may generate the control signal CS for controlling the voltage generation circuit 500 (see FIG. 5) based on the calculated threshold voltage of the dummy cell transistor.

Figure 8:
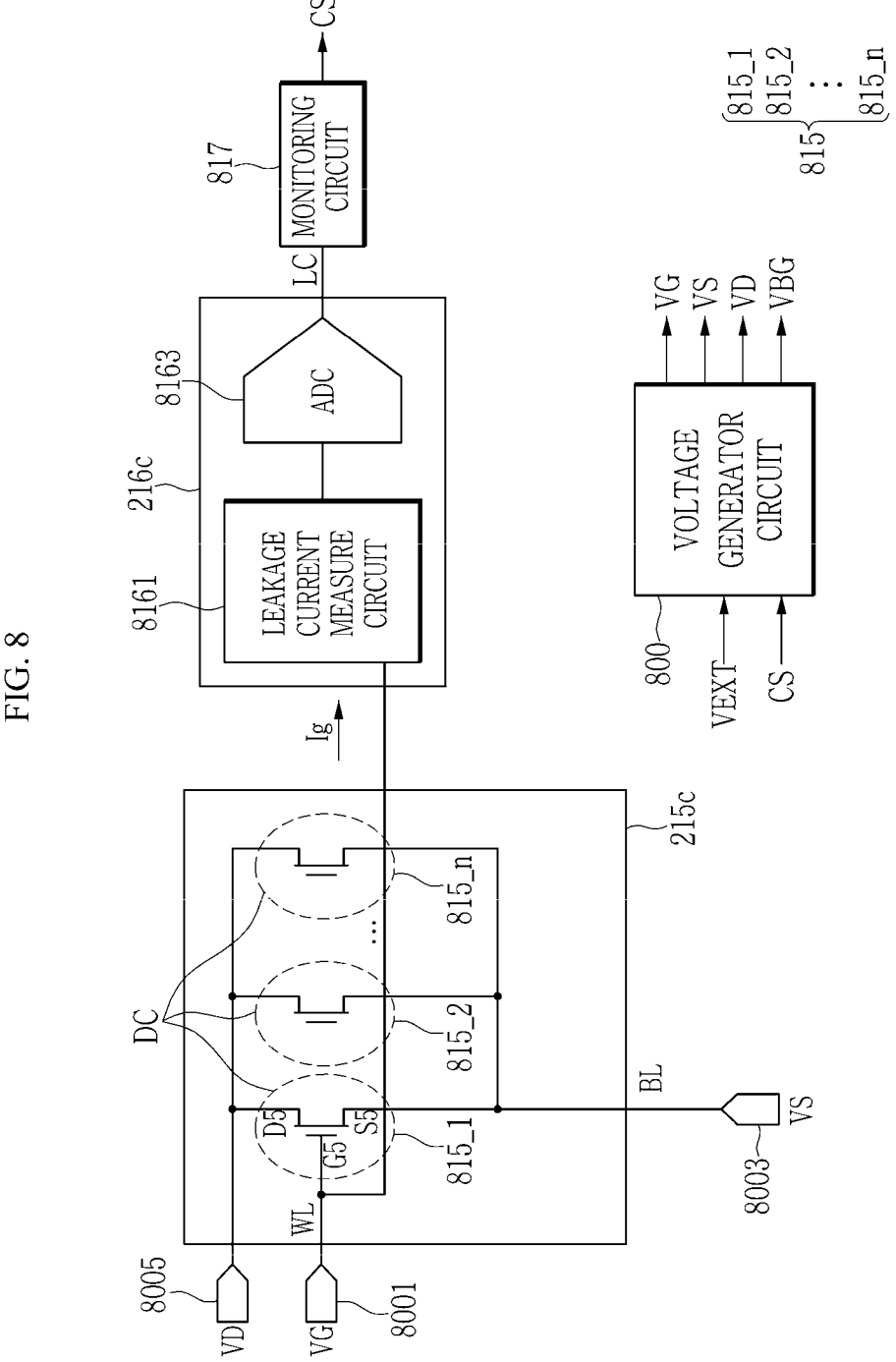
FIG. 8 is a view showing a dummy cell array, a measuring circuit, a monitoring circuit, and a voltage generation circuit according to an embodiment.

FIG. 8 is a schematic diagram showing at least a portion of an example dummy cell array, a measuring circuit, a monitoring circuit, and a voltage generation circuit, according to one or more embodiments.

In the following, a dummy bank 215c of a plurality of dummy cell arrays 215 (FIG. 2) and a measuring circuit 216c of a plurality of measuring circuits 216 (FIG. 2) will be described as examples. Hereinafter, the description of the dummy bank 215c and the measuring circuit 216c may be equally applied to each of the plurality of dummy cell arrays 215 and each of the plurality of measuring circuits 216 (see FIG. 2).

In the following, a dummy cell transistor 815_1 among a plurality of dummy cell transistors 815_1, 815_2, . . . , 815_n will be described as an example. Hereinafter, the description of the dummy cell transistor 815_1 may be equally applied to each of the plurality of dummy cells transistors 815_1, 815_2, . . . , 815_n.

As shown in FIG. 8, the dummy bank 215c may include a plurality of dummy cells (DC of FIG. 2). The dummy cell DC may include a dummy cell transistor 815_1 connected to a corresponding word line WL and bit line BL. Although not explicitly shown in FIG. 8, the dummy bank 215c may include various devices other than the dummy cell transistors 815.

The gate voltage VG may be applied to the gate G5 of the dummy cell transistor 815_1. The gate voltage VG may be provided as a level at which the dummy cell transistor 815_1 is turned on or turned off. The gate G5 of the dummy cell transistor 815_1 may be connected to the word line WL. The word line WL may be connected to a gate voltage application pin 8001. In some embodiments, the gate G5 of the dummy cell transistor 815_1 may be connected to the gate voltage application pin 8001 through the word line WL. The gate voltage VG may be applied to the gate G5 of the dummy cell transistor 815_1 through the gate voltage application pin 8001. Meanwhile, In FIG. 8, the gate voltage application pin 8001 is shown as being connected to the gate G5 of the dummy cell transistor 815_1 through the word line WL, but the present disclosure is not limited thereto, and the gate voltage application pin 8001 may be connected to the gate G5 of the dummy cell transistor 815_1 through an alternative connection other than the word line WL.

The source voltage VS may be applied to the source S5 of the dummy cell transistor 815_1. The source S5 of the dummy cell transistor 815_1 may be connected to sources of the other dummy cell transistors 815_2, . . . , 815_n. On the other hand, in FIG. 8, it is shown that a source voltage application pin 8003 is connected to the source S5 of the dummy cell transistor 815_1 through the bit line BL, but the present disclosure is not limited thereto. For example, the source voltage application pin 8003 may be connected to the dummy cell transistor 815_1 through an alternative connection.

Based on the difference between the gate voltage VG and the source voltage VS applied to the dummy cell transistor 815_1, the dummy cell transistor 815_1 may be turned off or turned on. For example, assuming the source voltage VS having a fixed value is applied to the source S5, the on-off state of the dummy cell transistor 815_1 can be controlled by controlling the gate voltage VG applied to the gate G5 of the dummy cell transistor 815_1.

The drain voltage VD may be applied to the drain D5 of the dummy cell transistor 815_1. The drain D5 of the dummy cell transistor 815_1 may be connected to the drains of the other dummy cell transistors 815_2, . . . , 815_n. For example, a drain voltage application pin 8005 may be connected to the drain D5 of the dummy cell transistor 815_1 through an arbitrary line.

When the gate voltage VG, the source voltage VS, and the drain voltage VD have the fixed values and the dummy cell transistor 815_1 is turned off due to the voltage difference between the gate voltage VG and the source voltage VS, the current flowing from the gate G5 to the body may be referred to as a gate leakage current.

In some embodiments, a leakage current measure circuit 8161 may be configured to measure the gate current Ig output from a plurality of dummy cell transistors 815. For example, the gate current Ig may be a gate leakage current.

When a voltage generation circuit 800 applies the source voltage VS, the gate voltage VG, and the drain voltage VD, corresponding to a third voltage condition, the measuring circuit 216c may measure the gate current output from the gate G5 of the dummy cell transistor 815_1 in the dummy cell array 815. In this case, the gate current measured by the measuring circuit 216c may be a gate leakage current. In some embodiments, the third voltage condition may include the source voltage VS corresponding to the first voltage, the gate voltage VG corresponding to the second voltage having a value lower than the first voltage, and the drain voltage VD corresponding to the third voltage having a value lower than the second voltage.

The measuring circuit 216c may further include an ADC 8163 connected to the leakage current measure circuit 8161. The ADC 8163 may be configured to generate, as an output, a digitized version of the analog input signal supplied by the leakage current measure circuit 8161. The output signal generated by the ADC 8163 may be a digitized leakage current LC.

A monitoring circuit 817 may calculate the threshold voltage of the dummy cell transistor 815_1 based on the measured gate leakage current signal LC generated by the measuring circuit 216c and adjust the voltage applied to the dummy cell transistors 815 by generating the control signal CS.

Also, in another embodiment, the monitoring circuit 817 may calculate the threshold voltage of the dummy cell transistor 815_1 and generate the control signal CS based on the leakage value LC for the gate current Ig.

The correlation between the gate-source voltage and the gate voltage Ig may be set in advance. The monitoring circuit 817 may calculate the threshold voltage of the dummy cell transistor 815_1 based on the gate voltage VG applied by the voltage generation circuit 800, the drain voltage VD, the leakage value LC for the gate current Ig.

In some embodiments, the monitoring circuit 817 may generate the control signal CS so that the voltage generation circuit 800 generates a new gate voltage. For example, the monitoring circuit 817 may generate the control signal CS so that the gate voltage VG is positioned within a predetermined range with the threshold voltage as a reference.

Figure 9:
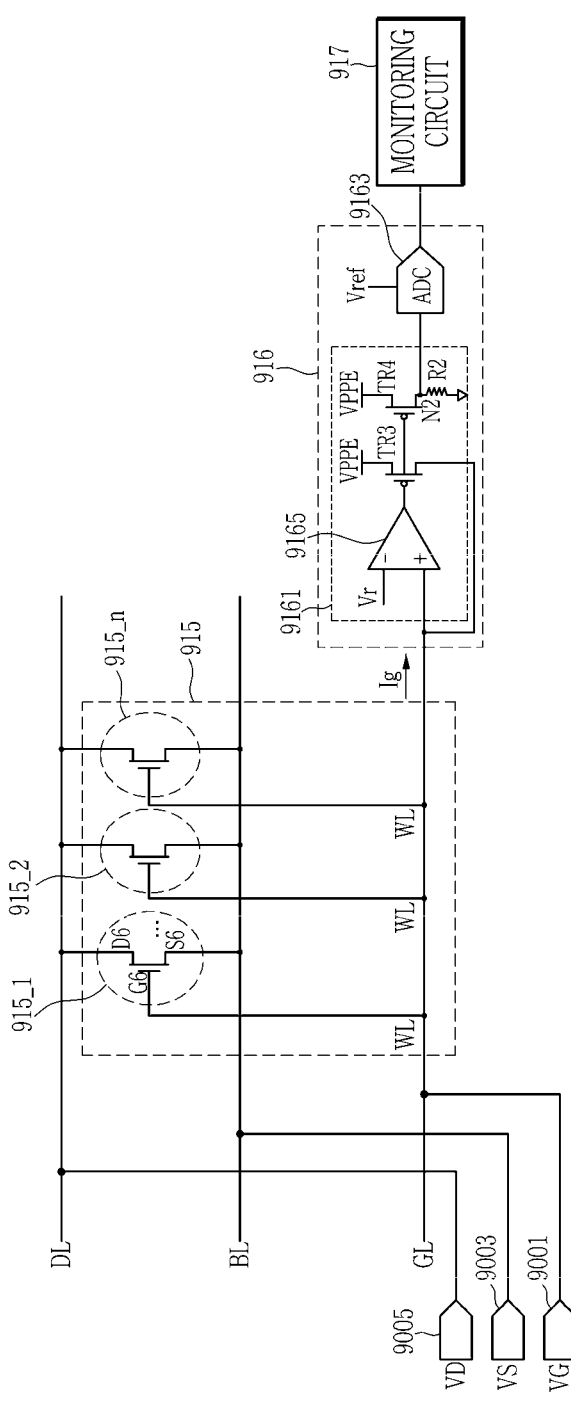
FIG. 9 is a view showing a dummy cell array, a measuring circuit, and a monitoring circuit according to another embodiment.

Similarly, the monitoring circuit 817 may generate the control signal CS so that the voltage generation circuit 800 generates a new source voltage and/or a new drain voltage FIG. 9 is a schematic diagram showing at least a portion of an example dummy cell array 915, a measuring circuit 916, and a monitoring circuit 917, according to another embodiment. Specifically, FIG. 9 is a view showing an illustrative circuit implementation of the measuring circuit 216c in FIG. 8, according to one or more embodiments.

As shown in FIG. 9, gates G6 of a plurality of dummy cell transistors 915_1, 915_2, . . . , 915_n in the dummy cell array 915 may be connected to a common gate line GL. Drains D6 of the plurality of dummy cell transistors 915_1, 915_2, . . . , 915_n may be connected to a common drain line DL. Sources S6 of the plurality of dummy cell transistors 915_1, 915_2, . . . , 915_n may be connected to a common bit line BL. A gate voltage VG may be applied to the gates G6 of the dummy cell transistors 915_1, 915_2, . . . , 915_n through a gate terminal pin 9001, a source voltage VS may be applied to the sources S6 of the dummy cell transistors through a source terminal pin 9003, and a drain voltage VD may be applied to the drains D6 of the dummy cell transistors through a drain terminal pin 9005.

In some embodiments, when the voltage generation circuit (800 of FIG. 8) applies the source voltage VS, the gate voltage VG, and the drain voltage VD, which correspond to the third voltage condition, the measuring circuit 916 may be configured to measure the gate current Ig output from the gate G6 of the dummy cell transistor 915_1 in the dummy cell array 915. At this time, the gate current measured by the measuring circuit 916 may be a gate leakage current. In some embodiments, the third voltage condition may include the source voltage VS corresponding to a fifth voltage, the gate voltage VG corresponding to a sixth voltage having a value lower than the fifth voltage, and the drain voltage VD corresponding to a seventh voltage having a value lower than the sixth voltage. The monitoring circuit 917 may adjust the voltage applied to the dummy cell transistors 915_1, 915_2, . . . , 915_n in the dummy cell array 915 by calculating the threshold voltage of the dummy cell transistor 915_1 based on the measured gate leakage current and generating the control signal CS (FIG. 8).

The measuring circuit 916 may be connected to the gate G6 of the dummy cell transistor 915_1 in the dummy cell array 915. The measuring circuit 916 may include a leakage current measure circuit 9161 and an ADC 9163. The leakage current measure circuit 9161 may include an operational amplifier 9165 configured in a manner consistent with the current measure circuit 6161 shown in FIG. 6. A voltage of Vr may be input to the inverting input terminal (−) of the operational amplifier 9165. In this case, Vr may be an arbitrary voltage. The voltage at the gates G6 of the dummy cell transistors 915_1, 915_2, . . . , 915_n may be applied to the non-inverting input terminal (+) of the operational amplifier 9165. The operational amplifier 9165 will generate an output signal that is indicative of a comparison between the voltage Vr and the gate voltage of the dummy cell transistors 915_1 through 915_n.

The leakage current measure circuit 9161 may include a third transistor TR3 and a fourth transistor TR4 connected to the output terminal of the operational amplifier 9165. Each of the third transistor TR3 and the fourth transistor TR4 may be a MOSFET. In some embodiments, the third transistor TR3 and the fourth transistor TR4 may be an NMOS transistor or a PMOS transistor. One terminal (source) of the third transistor TR3 may be connected to a VPPE voltage source, and the other terminal (drain) may be connected to the gate line GL. One terminal (source) of the fourth transistor TR4 may be connected to the VPPE voltage source, and the other terminal (drain) may be connected to a resistor R2 at node N2. The other terminal of the resistor R2 may be grounded.

In some embodiments, when there is no gate leakage current output from the dummy cell array 915, a current may not flow through the gate G6 of the dummy cell transistor 915_1. Accordingly, the voltages applied to the inverting input terminal (−) and the non-inverting input terminal (+) of the operational amplifier 9165 may be the same. That is, the voltage Vr may be applied to the gate line GL by way of the feedback connection arrangement of the operational amplifier 9165.

Meanwhile, when there is leakage current output from the dummy cell array 915, the leakage current may flow through gate G6 of the dummy cell transistor 915_1. For example, the leakage current may flow from the gate G6 of the dummy cell transistor 915_1 to the body direction. The amount of the current input to the operational amplifier 9165 may be reduced as much as the amount of the current reduced by the leakage current. The third transistor TR3 may reduce the voltage of the non-inverting input terminal of the operational amplifier 9165 by changing the current input to the non-inverting input terminal (+).

Accordingly, the output voltage of the operational amplifier 9165 is reduced, and the third transistor TR3 may compensate for the voltage input to the non-inverting input terminal (+) of the operational amplifier 9165 by the reduced output voltage. Specifically, as the amount of the current input to the operational amplifier 9165 decreases, the voltage input to the gates of the third transistor TR3 and the fourth transistor TR4 may decrease. Accordingly, the current flowing through the third transistor TR3 may increase, which may be fed back to the non-inverting input terminal (+) of the operational amplifier 9165 and compensate for the voltage difference of the non-inverting input terminal (+) and the inverting input terminal (−) of the operational amplifier 9165. So, the voltage input to the non-inverting input terminal (+) of the operational amplifier 9165 can be maintained as Vr. With the gate of transistor TR3 connected to the gate of transistor TR4, and the source of transistor TR3 connected to the source of transistor TR4, the two transistors may be connected in a current mirror configuration. The voltage input to the gate of the third transistor TR3 may vary based at least in part on the amount of the leakage current output from the dummy cell array 915. Similarly, the voltage input to the gate of the fourth transistor TR4 may vary based at least in part on the amount of the leakage current output from the dummy cell array 915.

Similarly, as the voltage applied to the gate of the third transistor TR3 fluctuates, the voltage applied to the gate of the fourth transistor TR4 may also vary. The voltage applied to the gate of the third transistor TR3 and the voltage applied to the gate of the fourth transistor TR4 may be the same. The current flowing through resistor R2 may vary according to the voltage applied to the gate of fourth transistor TR4. Depending on the current flowing through the resistor R2, the voltage applied to the second node N2 of the fourth transistor TR4 may vary. The voltage applied to the second node N2 may be input to the ADC 9163.

The monitoring circuit 917 may be configured to predict the change in the threshold voltage of the dummy cell transistor 915_1 in the dummy cell array 915 based on the difference between the voltage value of the second node N2 when there is no leakage current and the voltage value of the second node N2 when there is a leakage current. The degree of the variation of the threshold voltage according to the variation of the voltage value applied to the second node N2 may be set in advance.

In some embodiments, the monitoring circuit 917 may generate the control signal CS for measuring the degree of the degradation of the dummy cell array 915. The gate voltage VG for measuring the degree of degradation of the dummy cell array 915 is described with reference to FIGS. 9 and 10 together.

Figure 10:
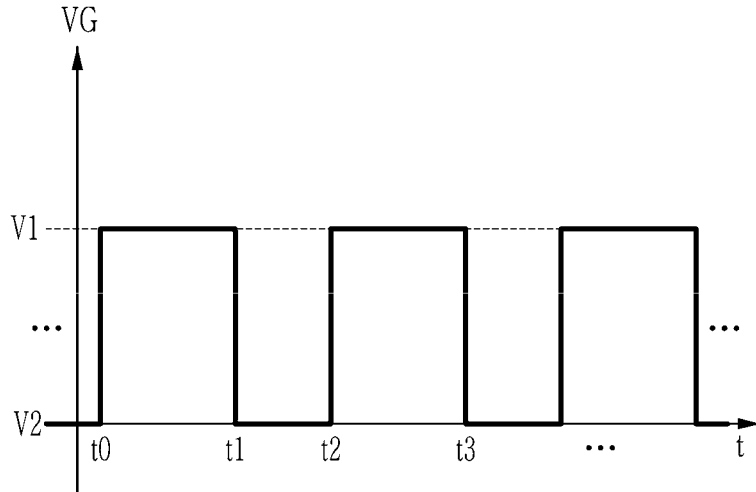
FIG. 10 is a graph showing a change over a time of a gate voltage applied to a memory device according to an embodiment.

FIG. 10 is a graph showing a change in a gate voltage VG applied to a memory device as a function of time t, according to an embodiment.

In some embodiments, the monitoring circuit 917 shown in FIG. 9 may generate the control signal CS that causes the voltage generation circuit (800 of FIG. 8) to apply an extreme condition to the dummy bank (e.g., 215c in FIG. 8). The term "extreme condition" as used herein is intended to refer to parameters to which a circuit may be subjected that are beyond normal operating parameters of the circuit, and may include voltages, temperatures and/or pressures, among other factors, exceeding prescribed threshold values for such parameters.

As shown in FIG. 10, the monitoring circuit 917 may generate the control signal CS that causes the voltage generation circuit 800 (FIG. 8) to repeatedly apply the gate voltage VG having a first voltage V1 and a second voltage V2. The first voltage V1 may be higher than the second voltage V2. Although the gate voltage VG is shown in FIG. 10 as a square wave varying between the voltages V1 and V2, embodiments of the inventive concept are not limited thereto. The degradation may occur in the dummy cell transistor 915_1 when the first voltage V1, which may be a high voltage, and the second voltage V2, which may be a low voltage, are repeatedly and alternately applied to the dummy cell transistor 915_1. For example, the voltage generation circuit 800 (FIG. 8) may generate the gate voltage VG of the first voltage V1 at t0, generate the gate voltage VG of the second voltage V2 at t1 after a predetermined time passes, and generate the gate voltage VG of the first voltage V1 at t2 and the gate voltage VG of the second voltage V2 at t3. Meanwhile, in FIG. 10, the first voltage V1 and the second voltage V2 are shown to have a constant voltage value, but the present disclosure is not limited thereto, and the first voltage V1 may have a relatively high arbitrary voltage, and the second voltage V2 may have a relatively low arbitrary voltage.

As another example, the monitoring circuit 917 of FIG. 9 may control a temperature control sensor to apply a high temperature to the dummy cell array 915. As another example, the monitoring circuit 917 may control a pressure control sensor to apply a high pressure to the dummy cell array 915.

After the voltage generation circuit (800 in FIG. 8) applies the extreme condition to the dummy cell array 915, the monitoring circuit 917 may calculate the threshold voltage of the dummy cell transistor 915_1 based on the gate current Ig of the dummy cell array 915. In some embodiments, the monitoring circuit 917 may be configured to compare the threshold voltage of the dummy cell transistor 915_1 before applying the extreme condition and the threshold voltage of the dummy cell transistor 915_1 after applying the extreme condition to measure the degree of degradation of the dummy cell transistor 915_1.

FIG. 11 is a flowchart showing at least a portion of an example method of operating a memory device, according to one or more embodiments.

With reference to FIG. 11, the monitoring circuit (e.g., 217 in FIG. 3) is configured to apply a predetermined voltage to each of the source, the drain, and the gate of the dummy cell transistor in advance (S1101).

For example, monitoring circuit 217 (FIG. 3) may apply the predetermined voltage to each of the source, the drain, and the gate of the dummy cell transistor depending on one voltage condition among a first voltage condition to measure a dynamic leakage current, a second voltage condition to measure a static leakage current, and a third voltage condition to measure a gate leakage current.

Next, the measuring circuit (e.g., 216a of FIG. 3) is configured to measure at least one of the current flowing in and the voltage applied to the dummy cell transistor (S1103).

Next, the monitoring circuit 217 is configured to calculate the threshold voltage of the dummy cell transistor based at least in part on at least one value of the measured current and voltage (S1105).

Next, the monitoring circuit 217 is configured to set a back gate (i.e., bulk) voltage based on a difference between a target threshold voltage and the calculated threshold voltage (S1107).

The monitoring circuit 217 is configured to set a target gate voltage corresponding to the target threshold voltage (S1109).

At least one memory cell transistor in the memory cell array (e.g., 210 in FIG. 2) may be driven with the set back gate voltage and the set target gate voltage (S1111).

Figure 12:
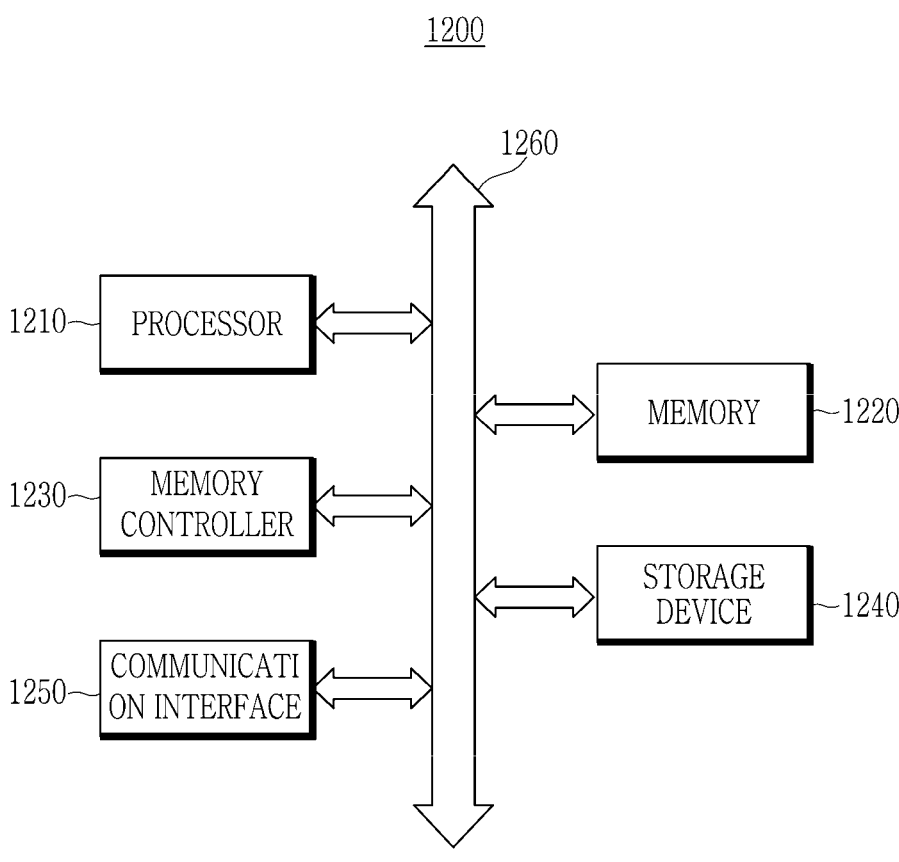
FIG. 12 is a block diagram showing an example of a computer device according to an embodiment.

FIG. 12 is a block diagram showing an example of a computing device according to an embodiment.

Referring to FIG. 12, a computing device 1200 includes a processor 1210, a memory 1220, a memory controller 1230, a storage device 1240, a communication interface 1250, and a bus 1260. The computing device 1200 may further include other general-purpose constituent elements.

The processor 1210 may be configured to control the overall operation of each component of the computing device 1200. The processor 1210 may be implemented as at least one of various processing units, such as, but not limited to, a central processing unit (CPU), an application processor (AP), and a graphics processing unit (GPU).

The memory 1220 may store various data and/or instructions. The memory 1220 may be implemented with the memory device described with reference to FIG. 1 to FIG. 11. The memory 1220 may include a plurality of memory cells and a plurality of dummy cells configured to store the data and/or the instructions. Meanwhile, as the size of the memory 1220 is down-sized, the characteristics of a plurality of transistors constituting a plurality of memory cells may greatly change due to a fine difference in a fabrication process for forming the memory cells. For example, a threshold voltage of a plurality of transistors may be different from a threshold voltage intended during design. The memory 1220 according to an embodiment may be configured to adjust the voltages applied to the gate, the drain, the source, and the back gate (i.e., bulk) of each of at least a subset of transistors in the memory 1220 in order to stably control various operation characteristics of the memory cells in the memory 1220. Specifically, the memory 1220 may measure a leakage current flowing through a dummy cell transistor (representative of each of the memory cells in the memory 1220) and calculate the threshold voltage of the dummy cell transistor based on the measured leakage current. After that, the memory 1220 may control the dummy cell transistor to have the intended threshold voltage and gate voltage by adjusting the voltages applied to the gate, the drain, the source, and the back gate of each transistor. In addition, the memory 1220 may accurately read the data and the instructions stored in the memory cell by using the adjusted gate voltage and the back gate voltage. Accordingly, the memory 1220 may be capable of accurate control considering process errors.

The memory controller 1230 may be configured to control the transfer of the data or instructions to and from the memory 1220. The memory controller 1230 may be implemented by the memory controller described with reference to FIG. 1 to FIG. 11. In some embodiments, the memory controller 1230 may be provided as a separate chip from the processor 1210. In some embodiments, the memory controller 1230 may be provided as an internal component of the processor 1210.

The storage device 1240 may non-temporarily store programs and/or data. In some embodiments, the storage device 1240 may be implemented by a non-volatile memory. The communication interface 1250 may support a wired/wireless Internet communication of the computing device 1200. In addition, the communication interface 1250 may support various communication methods and protocols other than Internet communication. The bus 1260 may provide a communication function between constituent elements of the computing device 1200. The bus 1260 may include at least one type of bus according to a communication protocol between constituent elements.

In some embodiments, each constituent element, module, or unit expressed as a block in FIG. 1 to FIG. 11 may be implemented with various numbers of hardware, software, and/or firmware structures that execute each function described above according to embodiments. For example, at least one constituent elements, module or unit may include various hardware constituent elements including a digital circuit, which can execute each function through control of at least one microprocessor or other control devices, other circuits using digital circuit structures such as a programmable or non-programmable logic device or array, an application specific integrated circuit (ASIC), or a memory, a processor, a logic circuit, a lookup table, and the like. In addition, at least one constituent element, module or unit includes at least one executable instruction word for performing a specific logic function and may be executed by at least one microprocessor or other control devices. In addition, at least one constituent element, module, or unit may include a processor such as a CPU or microprocessor that performs each function or may be implemented by a processor. A functional feature of any embodiment can be implemented as an algorithm running on at least one processor.

As may be used herein, the term "and/or" when used in conjunction with an associated list of elements is intended to include any and all combinations of one or more of the associated listed elements. For example, the phrase "A and/or B" is intended to include element A alone, element B alone, or elements A and B. Similarly, the term "at least one of" following by a list of elements is intended to include any and all combinations of one or more of the associated list of elements.

The terminology used herein is for the purpose of describing particular illustrative embodiments of the inventive concepts only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," as used herein, are intended to specify the presence of stated features, integers, steps, operations, elements, and/or components, but do not necessarily preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

In accordance with embodiments of the present disclosure described herein, when an element such as a device or circuit, for example, is referred to as being "connected" or "coupled" to another element, it is to be understood that the element can be directly connected or coupled to the other element or that intervening elements may be present. In contrast, when an element is referred to as being "directly connected" or "directly coupled" to another element, it is intended that there are no intervening elements present.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A memory device, comprising:
a first cell including a first transistor and a capacitor connected to the first transistor, the capacitor storing a voltage corresponding to data;
a second cell including a second transistor;
a voltage generation circuit configured to apply respective voltages to a source, a gate, and a drain of the second transistor, and to a gate and a back gate of the first transistor;
a measuring circuit connected to the second cell, the measuring circuit configured to measure a current and/or a voltage output from the second cell, and to generate a leakage value based on at least one parameter of the current and/or voltage that was measured; and
a monitoring circuit connected to the measuring circuit, the monitoring circuit configured to calculate a threshold voltage of the second transistor based on a measured voltage of the drain of the second transistor, a current value supplied by a current source to the drain of the second transistor, and a source voltage applied to the source of the second transistor, and to generate a control signal for controlling the voltage generation circuit as a function of the threshold voltage.

2. The memory device of claim 1, wherein:
the voltage generation circuit is configured to apply a source voltage corresponding to a first voltage to the source of the second transistor, a gate voltage corresponding to a second voltage higher than the first voltage to the gate of the second transistor, and a drain voltage corresponding to a third voltage higher than the second voltage to the drain of the second transistor, and the current is a dynamic leakage current of the second cell.

3. The memory device of claim 1, wherein:

the voltage generation circuit is configured to apply a source voltage corresponding to a first voltage to the source of the second transistor, a gate voltage corresponding to a second voltage lower than the first voltage to the gate of the second transistor, and a drain voltage corresponding to a third voltage higher than the first voltage to the drain of the second transistor, and the current is a static leakage current of the second cell.

4. The memory device of claim 1, wherein:

the voltage generation circuit is configured to apply a source voltage corresponding to a first voltage to the source of the second transistor, a gate voltage corresponding to a second voltage lower than the first voltage to the gate of the second transistor, and a drain voltage corresponding to a third voltage lower than the second voltage to the drain of the second transistor, and the current is a gate leakage current of the second cell.

5. The memory device of claim 1, wherein:

the gate of the second transistor and the drain of the second transistor are connected together, and the current source is connected to the drain of the second transistor, and the measuring circuit includes an analog-to-digital converter connected to the drain of the second transistor and is configured to measure the voltage of the drain of the second transistor to generate the leakage value.

6. The memory device of claim 1, wherein the voltage generation circuit is configured to alternately apply a first voltage and a second voltage lower than the first voltage to the gate of the second transistor.

7. The memory device of claim 1, wherein the monitoring circuit is configured to generate the control signal so that the first transistor has a target threshold voltage based at least in part on a difference between the threshold voltage of the second transistor and a predetermined target threshold voltage.

8. The memory device of claim 7, wherein the control signal is configured to control the voltage generation circuit so as to apply a back gate voltage to the back gate of the first transistor based at least in part on the difference between the target threshold voltage and the threshold voltage.

9. The memory device of claim 8, wherein the control signal is configured to control the voltage generation circuit so that a gate voltage applied to the gate of the first transistor is included within a predetermined range with reference to the target threshold voltage.

10. The memory device of claim 9, wherein:

the monitoring circuit is configured to set a first gate voltage for turning off the first transistor and a second gate voltage for turning on the first transistor, and the first gate voltage is less than or equal to a predetermined first voltage with reference to the target threshold voltage, and the second gate voltage is greater than or equal to a predetermined second voltage with reference to the target threshold voltage.

11. The memory device of claim 1, wherein:

the measuring circuit includes an operational amplifier connected to the drain of the second transistor, a first PMOS transistor including a gate connected to an output terminal of the operational amplifier, a first source/drain connected to a voltage source, and a second source/drain connected to the drain of the second transistor, a second PMOS transistor including a gate connected to the output terminal of the operational amplifier, a first source/drain connected to the voltage source, and a second source/drain connected to a first node, and a resistor including a first terminal connected to the first node and a second terminal connected to ground, and the monitoring circuit is connected to the first node.

12. The memory device of claim 1, wherein:

the measuring circuit includes an operational amplifier connected to the gate of the second transistor, a first PMOS transistor including a gate connected to an output terminal of the operational amplifier, a first source/drain connected to a voltage source, and a second source/drain connected to a drain of the second transistor, a second PMOS transistor including a gate connected to the output terminal of the operational amplifier, a first source/drain connected to the voltage source, and a second source/drain connected to a first node, and a resistor including a first terminal connected to the first node and a second terminal connected to ground, and the monitoring circuit is connected to the first node.

13. A driving method of a memory device, the method comprising:

applying a predetermined voltage to a source, a drain, and a gate of a first transistor;

measuring a voltage applied to the first transistor and/or a current flowing in the first transistor;

calculating a threshold voltage of the first transistor based on a measured voltage of the drain of the first transistor, a current value supplied by a current source to the drain of the first transistor, and a source voltage applied to the source of the first transistor; and setting a back gate voltage applied to a back gate of a second transistor in the memory device based on a difference between a predetermined target threshold voltage for the second transistor and the threshold voltage of the first transistor.

14. The driving method of the memory device of claim 13, further comprising setting a first gate voltage for turning off the second transistor and a second gate voltage for turning on the second transistor, wherein the first gate voltage is less than or equal to a predetermined first voltage with reference to the predetermined target threshold voltage, and the second gate voltage is greater than or equal to a predetermined second voltage with reference to the predetermined target threshold voltage.

15. The driving method of the memory device of claim 13, wherein applying the predetermined voltage includes alternately applying a first voltage and a second voltage lower than the first voltage to the gate of the first transistor.

16. The driving method of the memory device of claim 13, wherein applying the predetermined voltage includes applying a source voltage corresponding to a first voltage to the source of the first transistor, a gate voltage corresponding to a second voltage higher than the first voltage to the gate of the first transistor, and a drain voltage corresponding to a third voltage higher than the second voltage to the drain of the first transistor.

17. The driving method of the memory device of claim 13, wherein applying the predetermined voltage includes applying a source voltage corresponding to a first voltage to the source of the first transistor, a gate voltage corresponding to a second voltage lower than the first voltage to the gate of the first transistor, and a drain voltage corresponding to a third voltage higher than the first voltage to the drain of the first transistor.

18. The driving method of the memory device of claim 13, wherein applying the predetermined voltage includes applying a source voltage corresponding to a first voltage to the source of the first transistor, a gate voltage corresponding to a second voltage lower than the first voltage to the gate of the first transistor, and a drain voltage corresponding to a third voltage lower than the second voltage to the drain of the first transistor.

19. The driving method of the memory device of claim 13, further comprising setting a gate voltage of the second transistor so that the gate voltage applied to a gate of the second transistor is included within a predetermined range with reference to the predetermined target threshold voltage.

20. A memory system, comprising:

a memory device including a first cell including a first transistor and a capacitor connected to the first transistor, the capacitor configured to store a voltage corresponding to data, and a second cell including a second transistor; and a memory controller configured to provide an external voltage to the memory device, wherein the memory device is configured to:

based on the provided external voltage, select, from a pre-determined voltage condition set, a first pre-determined voltage condition, apply a voltage to the second transistor according to the first pre-determined voltage condition selected based on the external voltage, and set a voltage applied to the first transistor based at least in part on a current and/or a voltage output from the second cell.

* * * * *